(12) United States Patent
Hirler et al.

(10) Patent No.: US 9,396,997 B2
(45) Date of Patent: Jul. 19, 2016

(54) METHOD FOR PRODUCING A SEMICONDUCTOR COMPONENT WITH INSULATED SEMICONDUCTOR MESAS

(75) Inventors: Franz Hirler, Isen (DE); Anton Mauder, Kolbemoor (DE); Hermann Gruber, Woerth an der Donau (DE); Hubert Rothleitner, Villach (AT); Andreas Peter Meiser, Sauerlach (DE)

(73) Assignee: Infineon Technologies AG, Neubiberg (DE)

(*) Notice: Subject to any disclaimer, the term of this patent is extended or adjusted under 35 U.S.C. 154(b) by 685 days.

(21) Appl. No.: 13/288,271

(22) Filed: Nov. 3, 2011

(65) Prior Publication Data

US 2012/0146133 A1 Jun. 14, 2012

Related U.S. Application Data

(63) Continuation-in-part of application No. 12/964,865, filed on Dec. 10, 2010, now Pat. No. 9,142,665.

(51) Int. Cl.
*H01L 21/76* (2006.01)
*H01L 21/768* (2006.01)
(Continued)

(52) U.S. Cl.
CPC .... *H01L 21/76898* (2013.01); *H01L 21/76224* (2013.01); *H01L 23/481* (2013.01); *H01L 29/0653* (2013.01); *H01L 29/42372* (2013.01); *H01L 29/7397* (2013.01); *H01L 29/7803* (2013.01); *H01L 29/7804* (2013.01); *H01L 29/7808* (2013.01); *H01L 29/7811* (2013.01); *H01L 29/7813* (2013.01); *H01L 21/823481* (2013.01); *H01L 24/16* (2013.01); *H01L 27/088* (2013.01); *H01L 29/402* (2013.01); *H01L 29/41741* (2013.01); *H01L 29/4238* (2013.01); *H01L 29/456* (2013.01); *H01L 29/66734* (2013.01); *H01L 2224/16245* (2013.01); *H01L 2924/01006* (2013.01); *H01L 2924/01013* (2013.01); *H01L 2924/01019* (2013.01);
(Continued)

(58) Field of Classification Search
CPC .............. H01L 21/76898; H01L 21/76224; H01L 29/0653; H01L 23/481
USPC .............. 257/329, 330, E23.262, E21.341, 257/E21.54; 438/268, 424, 430, 435
See application file for complete search history.

(56) References Cited

U.S. PATENT DOCUMENTS 6,836,020 B2 12/2004 Cheng
7,276,787 B2 * 10/2007 Edelstein et al. .............. 257/698
(Continued)

FOREIGN PATENT DOCUMENTS

DE 10 2009 028 485 A1 4/2010
WO 04001854 A2 12/2003

*Primary Examiner* — Victor A Mandala
*Assistant Examiner* — Colleen E Snow
(74) *Attorney, Agent, or Firm* — Murphy, Bilak & Homiller, PLLC

(57) ABSTRACT

A method for producing a semiconductor component is provided. The method includes providing a semiconductor body with a first surface and a second surface opposite to the first surface, etching an insulation trench from the first surface partially into the semiconductor body, forming a first insulation layer on one or more sidewalls of the insulation trench, processing the second surface by at least one of grinding, polishing and a CMP-process to expose the first insulation layer, and depositing on the processed second surface a second insulation layer which extends to the first insulation layer.

28 Claims, 26 Drawing Sheets

(51) Int. Cl.

| | | |
|---|---|---|
| *H01L 23/48* | (2006.01) | |
| *H01L 29/06* | (2006.01) | |
| *H01L 29/423* | (2006.01) | |
| *H01L 29/739* | (2006.01) | |
| *H01L 29/78* | (2006.01) | |
| *H01L 21/762* | (2006.01) | |
| H01L 21/8234 | (2006.01) | |
| H01L 23/00 | (2006.01) | |
| H01L 27/088 | (2006.01) | |
| H01L 29/40 | (2006.01) | |
| H01L 29/417 | (2006.01) | |
| H01L 29/45 | (2006.01) | |
| H01L 29/66 | (2006.01) | |

(52) U.S. Cl.
CPC ............... *H01L2924/01029* (2013.01); *H01L 2924/01068* (2013.01); *H01L 2924/01074* (2013.01); *H01L 2924/12035* (2013.01); *H01L 2924/12036* (2013.01); *H01L 2924/1305* (2013.01); *H01L 2924/1306* (2013.01); *H01L 2924/13055* (2013.01); *H01L 2924/13091* (2013.01); *H01L 2924/14* (2013.01)

(56) References Cited

U.S. PATENT DOCUMENTS

| | | | |
|---|---|---|---|
| 7,459,365 B2 * | 12/2008 | Rub et al. ................... | 438/268 |
| 7,943,449 B2 | 5/2011 | Mauder et al. | |
| 8,138,036 B2 | 3/2012 | Andry et al. | |
| 8,384,224 B2 | 2/2013 | Ding et al. | |
| 2006/0172494 A1 | 8/2006 | Kohlmann-Von Platen | |
| 2006/0214298 A1 * | 9/2006 | Huang et al. .............. | 257/758 |
| 2007/0048896 A1 * | 3/2007 | Andry et al. ............... | 438/106 |
| 2008/0012119 A1 | 1/2008 | Otremba et al. | |
| 2008/0079131 A1 * | 4/2008 | Kim et al. .................. | 257/686 |
| 2008/0135932 A1 | 6/2008 | Ozeki | |
| 2009/0032865 A1 | 2/2009 | Hirler | |
| 2009/0195855 A1 * | 8/2009 | Steyn et al. ................ | 359/290 |
| 2009/0322417 A1 | 12/2009 | Hirler | |

* cited by examiner

METHOD FOR PRODUCING A SEMICONDUCTOR COMPONENT WITH INSULATED SEMICONDUCTOR MESAS

RELATED APPLICATION

The present application is a continuation-in-part of previously filed U.S. Ser. No. 12/964,865 filed on Dec. 10, 2010, and herein incorporated by reference in its entirety.

TECHNICAL FIELD

Embodiments of the present invention relate to a method for producing a semiconductor component with at least two semiconductor mesas which are insulated from each other, and to a related semiconductor component. Further embodiments of the present invention relate to a method for producing a semiconductor component with an electrically conductive via extending through a semiconductor body, and to a semiconductor component with a via.

BACKGROUND

There are semiconductor components or devices which include at least a part of their device structure in the region of a first surface of a semiconductor body and which include a terminal for electrically contacting the device structure at a second surface of the semiconductor body. Such components further include an electrically conducting via which extends through the semiconductor body from the terminal at the second surface to the first surface.

The electrically conducting via is usually electrically insulated from surrounding regions of the semiconductor body. A via like this can be produced by: forming a trench, depositing an electrically insulating material at the sidewalls of the trench, and filling the remaining trench with an electrically conductive material.

There is a need to provide a method for producing a semiconductor component with an electrically conductive via extending through a semiconductor body which is properly insulated from surrounding regions of the semiconductor body.

Furthermore, insulating structures between different electronic circuits are often desirable for semiconductor based integrated circuits (ICs). Accordingly, leakage current and unwanted mutual interference of the different electronic circuits may be avoided or at least substantially reduced. Such devices may be manufactured using silicon on insulator (SOI) technology. However, SOI-technology is comparatively expensive. Furthermore, the material of the buried oxide (BOX) of the used SOI-wafer is typically limited to silicon oxide ($SiO_2$) and sapphire. Accordingly, there is a need to provide a flexible and cost-efficient method for producing a semiconductor component with circuits which are insulated from each other. This allows also flexible and cost-efficient producing of semiconductor components such as TEDFETs having isolated gate structures which extend along the whole drift zone and which can take voltage during a blocking mode.

SUMMARY

According to an embodiment of a method for producing a semiconductor component, the method includes: providing a semiconductor body with a first surface and a second surface which is opposite to the first surface; forming an insulation trench from the first surface into the semiconductor body; forming a first insulation layer at least on one or more sidewalls of the insulation trench; removing semiconductor material of the semiconductor body from the second surface to expose bottom portions of the first insulation layer and to form a back surface; and depositing a second insulation layer on the back surface. The processes are carried out such that at least two semiconductor mesas are formed which are insulated from each other by the first insulation layer and the second insulation layer.

According to an embodiment of a method for producing a semiconductor component, the method includes: providing a semiconductor body with a first surface and a second surface opposite to the first surface; etching an insulation trench from the first surface partially into the semiconductor body; forming a first insulation layer on one or more sidewalls of the insulation trench; processing the second surface by at least one of grinding, polishing and a CMP-process to expose the first insulation layer; and depositing on the processed second surface a second insulation layer which extends to the first insulation layer.

According to an embodiment of a semiconductor component, the semiconductor component includes a semiconductor body with a first surface and a back surface opposite to the first surface. At least one insulation trench having a first insulation layer extending from the first surface to the back surface is formed in the semiconductor body. The semiconductor component further includes a second insulation layer deposited on the back surface of the semiconductor body. The second insulation layer includes at least one of a silicon oxide, aluminum nitride, diamond like-carbon, boron-silicate glass, a spin-on glass, an organosilicate dielectric, a silicone, a polymerized imide, a parylene or a polymerized benzocyclobutene, a synthetic material, and a cured resin. At least two semiconductor mesas are formed in the semiconductor body. The at least two semiconductor mesas are laterally insulated from each other by the first insulation layer. At least one of the two semiconductor mesas is completely insulated on the back surface by the second insulation layer.

According to an embodiment of a method for producing a semiconductor component, the method includes: providing a semiconductor body with a first surface and a second surface opposite the first surface; forming an insulation trench which extends into the semiconductor body from the first surface and which in a horizontal plane of the semiconductor body defines a via region of the semiconductor body; forming a first insulation layer on one or more sidewalls of the insulation trench; removing semiconductor material of the semiconductor body from the second surface to expose at least parts of the first insulation layer, to remove at least parts of the first insulation layer, or to leave at least partially a semiconductor layer with a thickness of less than 1 µm between the first insulation layer and the second surface; forming a first contact electrode on the via region in the region of the first surface; and forming a second contact electrode on the via region in the region of the second surface.

According to an embodiment of a semiconductor component, the component includes: a semiconductor body with a first surface and a second surface; a first contact electrode in a region of the first surface; a second contact electrode in a region of the second surface; a semiconductor via region extending between the first and second contact electrodes; and an insulation layer separating the via region in a horizontal direction of the semiconductor body from other regions of the semiconductor body.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 1 which includes

FIG. 5 which includes

FIG. 7 which includes

DETAILED DESCRIPTION

FIGS. 1A to 1H illustrate a first embodiment of a method for producing a semiconductor component with an electrically conductive via extending through a semiconductor body. These figures show vertical cross-sections through a semiconductor body during or after particular method steps.

Figure 1A:
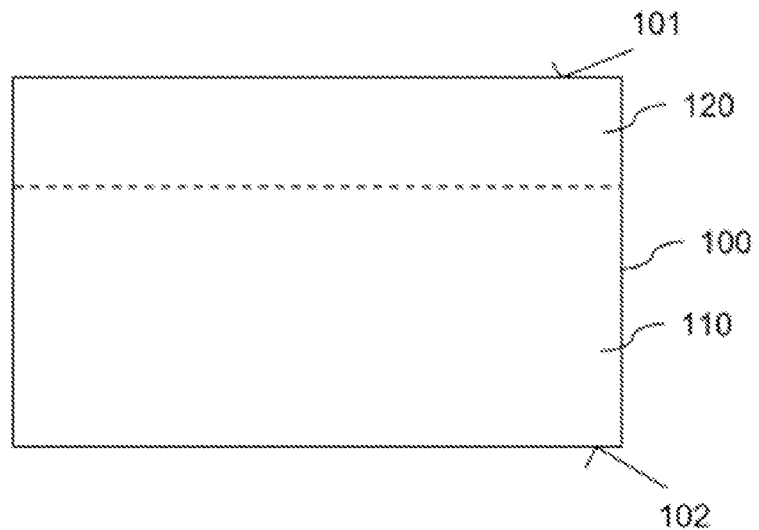
FIGS. 1A to 1H, illustrates vertical cross sections through a semiconductor body during a method according to a first embodiment for producing a semiconductor component with a semiconductor via.

Referring to FIG. 1A, the semiconductor body 100 is provided. The semiconductor body 100 includes a first surface 101 and a second surface 102 opposite the first surface 101. The vertical cross-sections illustrated in FIGS. 1A to 1H are cross-sections in a vertical section plane which is perpendicular to the first and second surfaces 101, 102.

The semiconductor body 100 can comprise a conventional semiconductor material, e.g. silicon (Si), silicon carbide (SiC), gallium arsenide (GaAs), gallium nitride (GaN), etc. The semiconductor body 100 is, in particular, a monocrystalline semiconductor body.

According to a first embodiment, the semiconductor body 100 has a homogeneous basic doping. Dependent on the specific type of the semiconductor component which is to be implemented, the basic doping can be an n-doping or a p-doping. According to a further embodiment, the semiconductor body 100 includes two differently doped semiconductor layers: a first semiconductor layer 110; and a second semiconductor layer 120 on top of the first semiconductor layer 110. The first semiconductor layer 110 is, for example, a semiconductor substrate, and the second semiconductor layer 120 is, for example, an epitaxial layer grown on the substrate 110. The two semiconductor layers 110, 120 can have different doping concentrations and/or doping types. According to one embodiment, the first layer 110 has a higher doping concentration than the second layer 120. The doping concentration of the first layer 110 is, for example, in the range of between $10^{18}$ cm$^{-3}$ and $10^{21}$ cm$^{-3}$ while the doping concentration of the second layer 120 is, for example, in the range of between $10^{14}$ cm$^{-3}$ and $10^{17}$ cm$^{-3}$. The doping types of the dopings of the first and second layers 110, 120 can be identical or can be complementary.

Figure 1B:
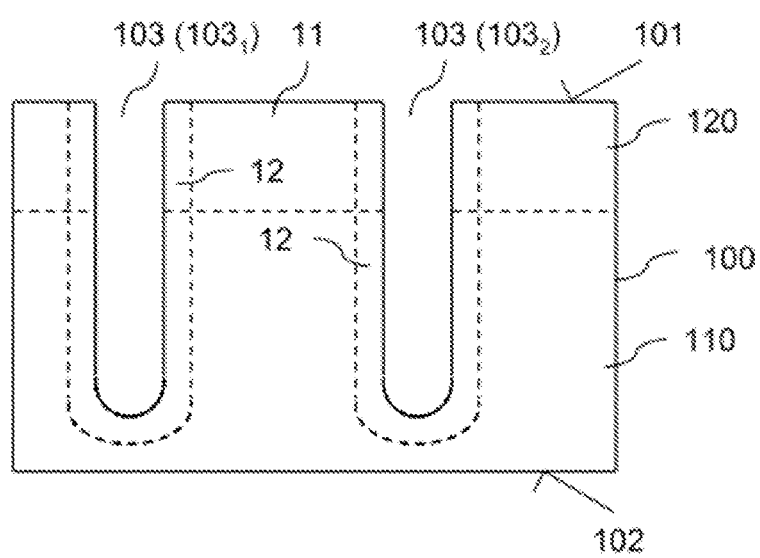

Referring to FIG. 1B, at least one insulation trench is formed which extends into the semiconductor body 100 from the first surface 101. In a horizontal plane of the semiconductor body 100, the at least one insulation trench 103 forms a closed loop or ring such that the at least one insulation trench 103 encloses a region 11 of the semiconductor body 100. The region 11 enclosed by the insulation trench 103 in the horizontal direction of the semiconductor body 100 will be referred to as a via region in the following. In the horizontal plane, the insulation trench 103 can be implemented in many different ways, i.e. with many different geometries. For illustration purposes, some examples will be explained with reference to embodiments illustrated in FIGS. 2 to 4.

Figures 2, 3:
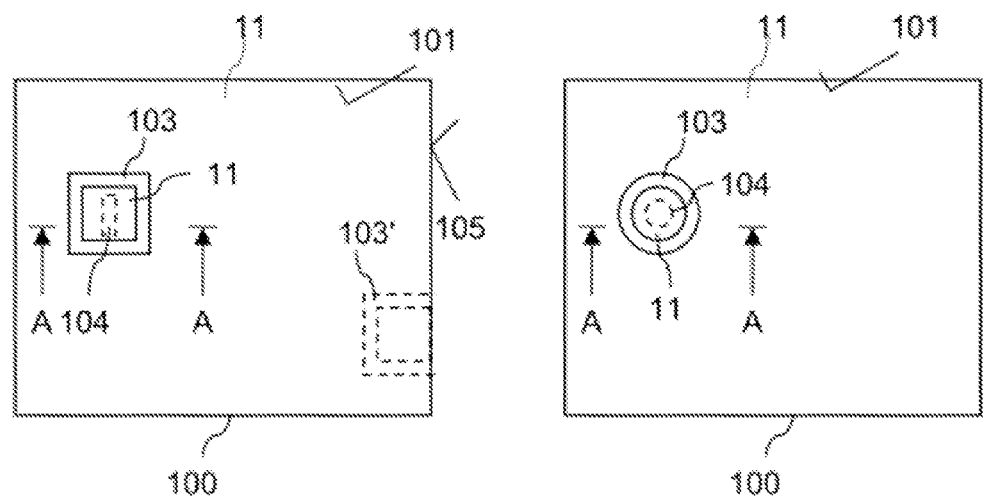
FIG. 2 illustrates a horizontal cross section through a semiconductor body which includes a rectangular semiconductor via region.
FIG. 3 illustrates a horizontal cross section through a semiconductor body which includes a circular semiconductor via region.

FIG. 2 shows a top view on the semiconductor body 100 after forming the insulation trench 103. In the embodiment illustrated in FIG. 2, the insulation trench 103 has a rectangular geometry. In this case, the insulation trench 103 is implemented as a rectangular ring or loop in a horizontal plane of the semiconductor body 100. Consequently, the semiconductor via region 11 enclosed by the insulation trench 103 is rectangular in the horizontal plane.

In the embodiment illustrated in FIG. 3, the insulation trench 103 has an ellipsoidal and, specifically, a circular geometry. Consequently, the semiconductor via region 11 enclosed by the insulation trench 103 has an ellipsoidal and, specifically, a circular geometry.

In the embodiments illustrated in FIGS. 2 and 3 the semiconductor via region 11 is defined by one insulation trench 103 which encloses the semiconductor via region 11. However, an insulation trench 103 with a rectangular geometry (see FIG. 2) or an ellipsoidal geometry (see FIG. 3) are only exemplary embodiments. The insulation trench 103 can have any other geometry, provided that the insulation trench 103 forms a closed loop or ring enclosing the semiconductor via region 11.

Figure 4:
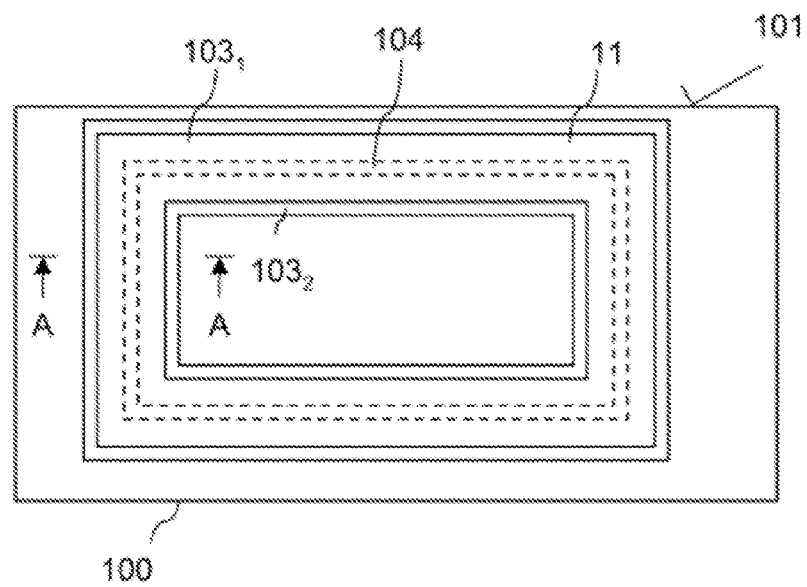
FIG. 4 illustrates a horizontal cross section through a semiconductor body which includes a ring-shaped semiconductor via region.

According to a further embodiment which is illustrated in FIG. 4, the semiconductor via region 11 is enclosed by two insulation trenches each of which forms a closed loop: a first insulation trench $103_1$, and a second insulation trench $103_2$ arranged within the loop defined by the first trench $103_1$. The first and the second trenches $103_1$, $103_2$ are spaced apart from one another so that the semiconductor via region 11 is disposed between the two trenches $103_1$, $103_2$. In the embodiment illustrated in FIG. 4, the first and second trenches $103_1$, $103_2$ basically have a rectangular geometry. However, this is only an example. These two trenches $103_1$, $103_2$ may have any other closed-loop geometry other than a rectangular geometry as well.

In the embodiments illustrated in FIGS. 2, 3 and 4, the trench 103 (in the horizontal plane) forms a closed loop which surrounds a semiconductor region, wherein the semiconductor region surrounded by the trench forms the via region 11. The trench with the closed-loop geometry separates the via region 11 in the horizontal direction from other regions of the semiconductor body 100. However, it is not necessary for the trench 103 to have a closed-loop geometry in order to define the via region 11. If, for example, the trench 103 is arranged close to an edge of the semiconductor body 100 and terminates at the edge of the semiconductor body 100, a closed-loop geometry is not required. This is illustrated in dashed lines in FIG. 2. In this Figure, reference numeral 105 denotes an edge of the semiconductor body 100 at which the semiconductor body 100 terminates.

A trench 103' (illustrated in dashed lines) terminates at the edge 105 and forms a closed loop with the edge so that the trench (together with the edge 105 of the semiconductor body) defines the via region 11. In this connection usually a plurality of semiconductor bodies which are part of a semiconductor wafer (not shown) are processed together, and the wafer is separated to form the individual semiconductor bodies at the end of such processing. Thus, when the trenches 103 or 103', respectively, are formed, the wafer has not yet been separated. At this time, lines (scribe lines) on the wafer define where the wafer is to be separated and, therefore, define where the edges of the individual wafers will be. At this time of processing, the trench 103' and the scribe line define the via region 11. The trench 103' can also be formed with a closed-loop geometry such that the trench 103' extends into the scribe line. In this case, the closed loop defined by this trench 103' is "opened" when the wafer is cut into the individual semiconductor bodies (dies) by cutting along the scribe lines.

In the embodiments drawn in solid lines of FIGS. 2 and 3 the trenches 103 define a silicon via 11 which is enclosed by the trench. Outside the closed-loop defined by the trench active component region, like active regions of a transistor can be arranged. In the embodiments of FIGS. 2 and 3, the area of the semiconductor body 100 enclosed by the trench is selected such that a via with a suitable/desired ohmic resistance is obtained. According to a further embodiment, active component regions are arranged in the semiconductor area enclosed by the trench 103 and the via is defined by the trench and the edge 105 of the semiconductor body 100. In this case, the via 11 (as shown in dotted lines in FIGS. 2 and 3) is arranged between the edge 105 and the trench 103 and forms a closed loop which encloses the trench 103, with the trench 103 forming a closed loop that encloses the active regions, like e.g., a field of transistor cells.

FIG. 1B represents a vertical cross-section through each of the embodiments illustrated in FIGS. 2, 3 and 4. In FIG. 1B, the reference signs in parentheses represent the reference signs for the embodiment according to FIG. 4. In the following "at least one insulation trench" means either one trench 103 as illustrated in FIGS. 2 and 3, or two trenches $103_1$, $103_2$ as illustrated in FIG. 4.

The at least one insulation trench 103, which extends in a vertical direction of the semiconductor body 100, can be produced using an etching method. Etching methods for producing a vertical trench in a semiconductor body are commonly known, so that no further explanation is required in this regard. "To extend in a vertical direction" means that the at least one trench 103 generally extends in the vertical direction. However, the trench can also be inclined relative to the first surface 101, so that an angle between sidewalls of the trench 103 and the first surface 101 can be different from 90°. The trench width can decrease or can increase with depth. Both sidewalls can also be tilted toward the same direction with the trench width being e.g. constant over the trench depth. The direction in which the trenches 103 are tilted can, for example, vary over the wafer.

The at least one insulation trench 103 is produced such that it does not completely extend through the semiconductor body 100 to the second surface 102. A depth of the insulation trench 103 is, for example, in the range of between 5 µm and 200 µm, in particular between 30 µm and 60 µm, like about 50 µm. A width of the trench is, for example, in the range of between 200 nm and 20 µm.

Figure 1C:
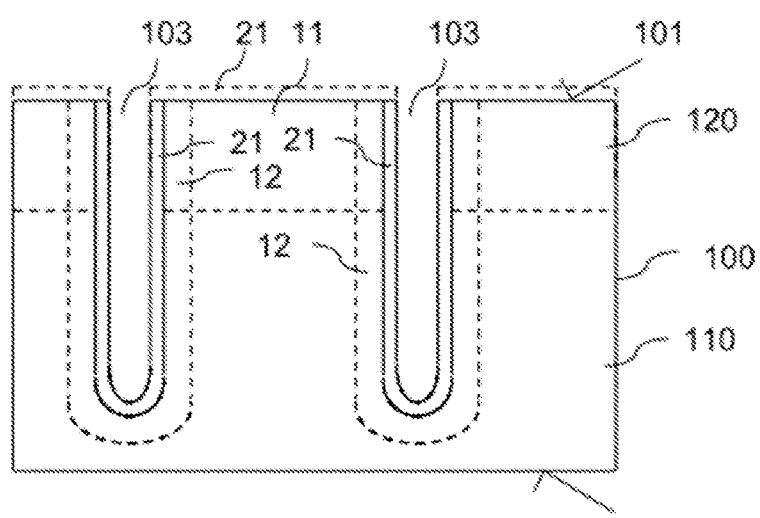

Referring to FIG. 1C, a first insulation layer 21 is formed at least on the sidewalls of the at least one insulation trench 103. In the embodiment illustrated in FIG. 1C, the first insulation layer 21 is formed on the sidewalls and on the bottom of the at least one insulation trench 103. The first insulation layer 21 is, for example, an oxide layer. The oxide layer can be produced by a thermal oxidation process and/or by a deposition process. The method, however, is not restricted to the use of an oxide as the insulation layer 21. Any other type of insulation or dielectric material may be used as well, like a nitride, aluminum oxide ($Al_2O_3$) or a low-k-dielectric. According to one embodiment, the first insulation layer 21 is a composite layer which includes two or more layers of an insulation material arranged one above the other.

Optionally, a doped semiconductor region 12 (illustrated in dashed lines) is produced in the semiconductor body 100 adjacent the insulation trench 103. The doped semiconductor region 12 has a higher doping concentration than the basic doping of the semiconductor body 100 or, when the semiconductor body 100 includes a higher doped first layer 110 and a lower doped second layer 120, has a doping concentration which is at least higher than the doping concentration of the lower doped semiconductor layer 120. The doped semiconductor region 12 is produced adjacent to the trench 103 at least in the via region 11, but can also be produced along the complete side walls and the bottom of the insulation trench 103. Forming the higher doped region 12 includes, for example: a deposition process, in which a doped glass or doped polysilicon is deposited, followed by a diffusion process; a gas phase doping process; or an implantation and/or diffusion process in which dopant atoms are implanted or diffused via the sidewalls (and optionally the bottom) of the insulation trench 103 into the semiconductor body 100.

Figure 1D:
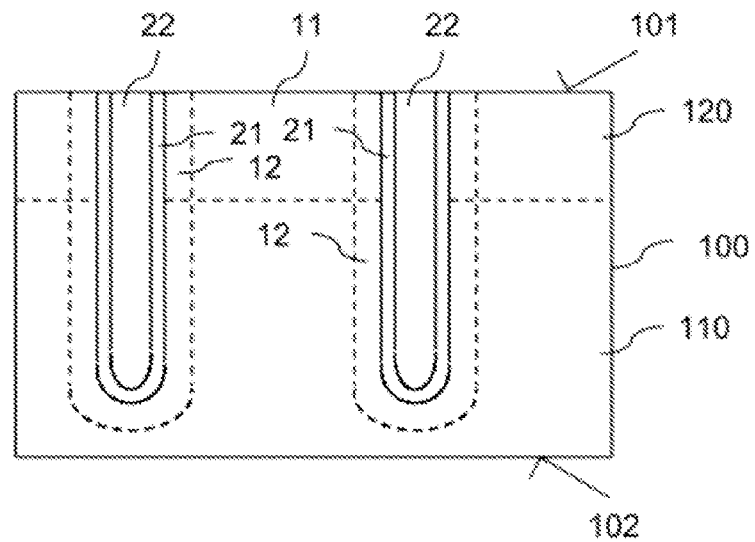
Figure 6:
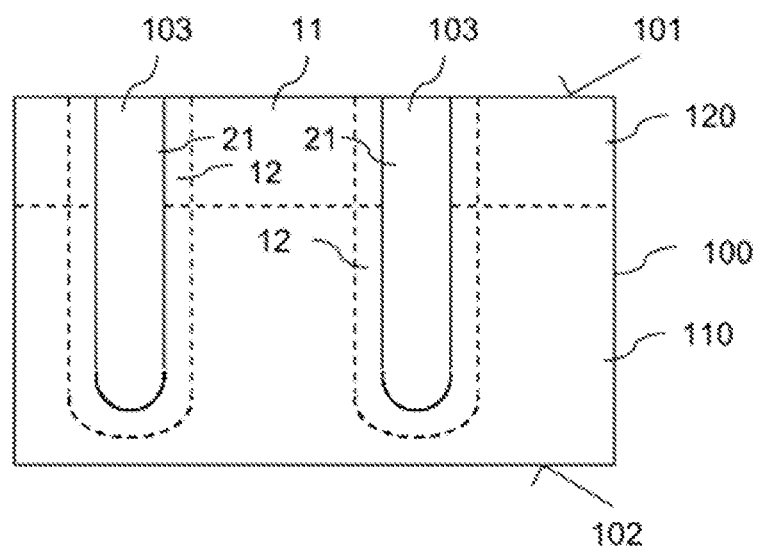
FIG. 6 illustrates a vertical cross section through the semiconductor component after process steps of a method according to a further embodiment.

In the embodiment illustrated in FIG. 1C the insulation layer 21 is produced along the sidewalls and the bottom of the insulation trench 103 such that a residual trench remains after the insulation layer 21 has been produced. Referring to FIG. 1D, this residual trench is filled with a filling material 22. The filling material 22 is, for example, an electrically conductive material, like a doped amorphous or polycrystalline semiconductor material, such as polysilicon, a metal, silicide or carbon. According to a further embodiment, the filling material 22 is an insulating material, so that the insulation trench 21 is completely filled with an insulation material. According to a further embodiment, which is illustrated in FIG. 6, the insulation layer 21 is produced such that it completely fills the insulation trench 103, so that there is no residual trench after the insulation layer 21 has been produced. In further embodiments a void may be enclosed in the trench 103 if, e.g., the opening of the trench 103 is closed during deposition before the trench 103 has been completely filled.

The insulation and filling materials are typically also deposited on the first surface 101 (e.g. on the trench etch mask) and second surface 102, which is not shown in FIG. 1C. After trench filling, these layers can be removed from the first and second surfaces 101, 102.

Figure 1E:
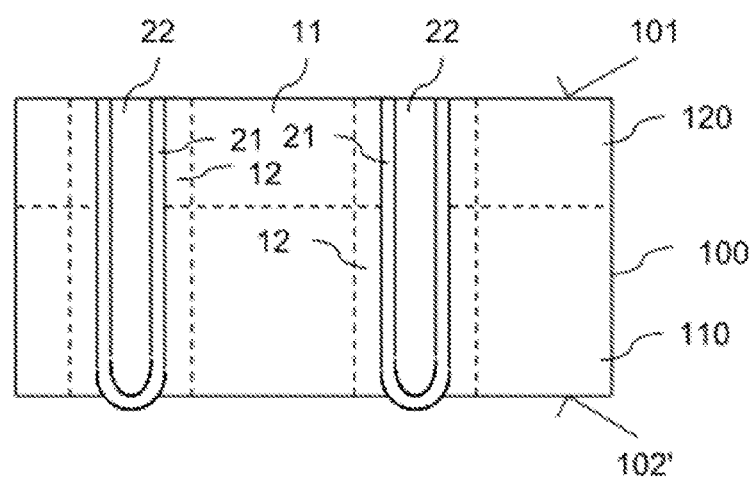

Referring to FIG. 1E, semiconductor material is removed from the second surface 102, so that a thickness—which corresponds to a vertical dimension of the semiconductor body 100—is reduced. For example, the removal of the semiconductor material at the second surface 102 includes at least one of an etching process, a mechanical polishing process, or a chemical-mechanical polishing (CMP) process. In FIG. 1E, reference character 102' denotes the second surface of the semiconductor body 100 after the removal process. In the following, the second surface 102' of the semiconductor body 100 is also referred to as back surface 102'. It should be mentioned that the semiconductor body is usually flipped or turned upside after having finished processing the first surface and before processing the second surface. However, for a better understanding such flipping of the semiconductor body 100 is not illustrated.

Referring to the embodiment illustrated in FIG. 1E, the removal process can be performed such that at the end of the removal process the first insulation layer 21 is uncovered at the second surface 102'. In the embodiment illustrated, the semiconductor material is removed down to below the bottom of the insulation trench 103, so that at the end of the removal process the first insulation layer 21 at the bottom of the insulation trench is uncovered at the second surfaces and protrudes from the second surface 102'. Thus, the second surface is not planarized in this method.

Figure 1F:
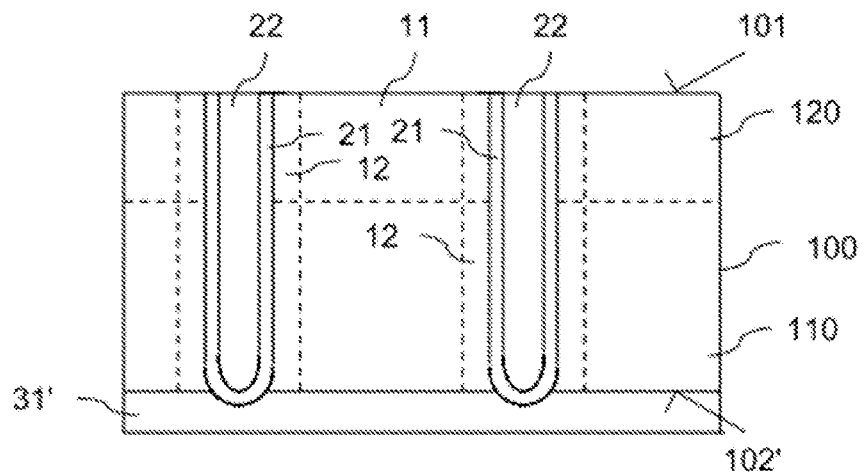
Figure 1G:
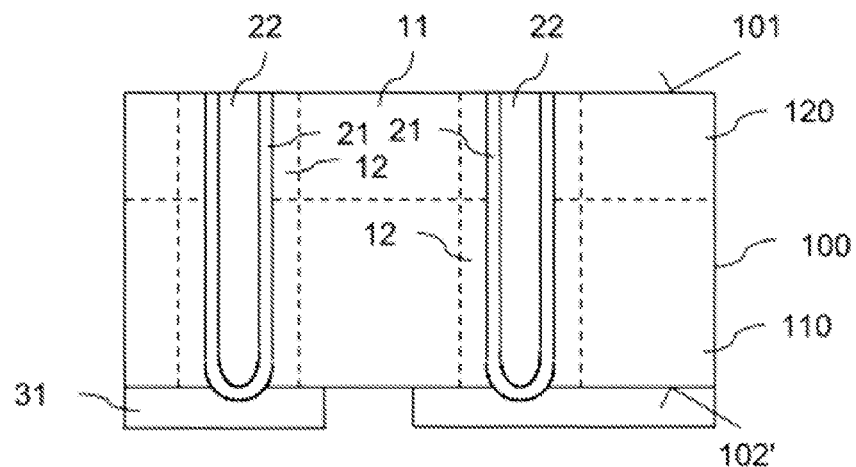

In next method steps, a second insulation layer 31 is formed on the second surface 102', with the second insulation layer 31 covering the uncovered region of the first insulation layer 21. Referring to FIGS. 1F and 1G, producing the second insulation layer 31 includes, for example, forming an insulation layer 31' which completely covers the second surface 102' (see FIG. 1F) and forming a contact opening in the insulation layer 31', with the contact opening extending to the via region 11. The contact opening is produced such that remaining sections 31 of the insulation layer 31' form the second insulation layer 31 which covers the at least one insulation trench 103 with the first insulation layer 21 at the second surface 102'. The second insulation layer 31 is, for example, an oxide layer or a nitride layer. The second layer 31 includes, in particular, a material which does not require high temperatures, like temperatures below 400° C., in the deposition process. Further suitable materials are, e.g., a spin-on glass or an imide. Before removing semiconductor material at the second surface 102, the device structures at and below the first surface can be finished or finally processed. This may include the deposition of metallization layers (not shown) on the first surface 101. Such metallization layers, however, cannot withstand high temperatures, like temperatures above 400° C.

Forming the second insulation layer 31 is optional. The insulation layer 21 at the bottom of the trenches can be sufficient to insulate the via region from surrounding semiconductor regions at the bottom of the trench.

For forming the second insulation layer 31, which adjoins the first insulation layer 21, it is not necessary to uncover the first insulation layer 21 in the removal process illustrated in FIG. 1E. According to an alternative embodiment, the semiconductor material is not removed down to the first insulation layer 21, but a (thin) layer of semiconductor material having a thickness of less than 1 μm remains below the first insulation layer 21 in the region of the second surface 102'. This is illustrated in dotted lines in FIG. 1E. In this case, forming the insulation layer 31' (see FIG. 1F) involves a process which transforms the semiconductor layer between the second surface 102' and the first insulation layer 21 into an insulation layer. Such a process is, for example, an oxidation process, like an anodic oxidation process, and/or a process in which oxygen is implanted into the semiconductor body 100 via the second surface 102'.

After the process steps illustrated in FIGS. 1E to 1G, the semiconductor via region 11 in a horizontal direction is completely enclosed by the insulation trench with the first insulation layer 21 and by the second insulation layer 31. The semiconductor via region 21 forms an electrically conductive connection between the first surface 101 and the second surface 102' of the semiconductor body 100, and is electrically insulated from other regions of the semiconductor body 100.

Figure 1H:
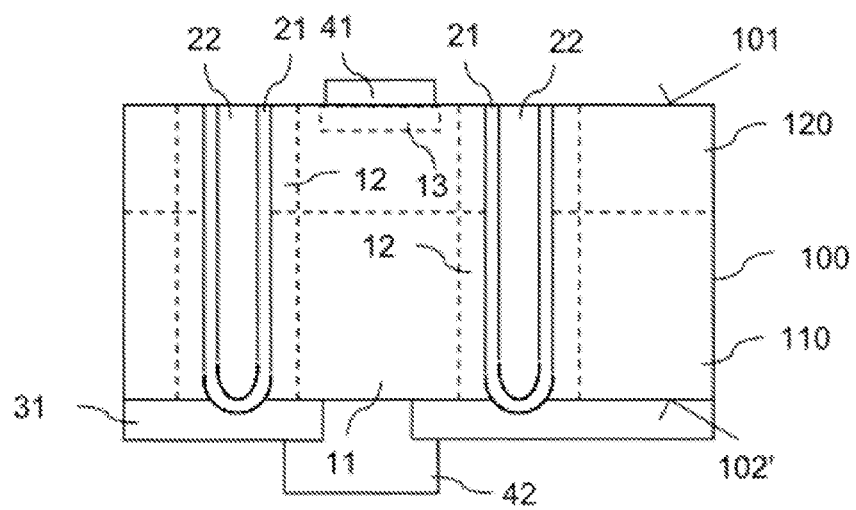

Referring to FIG. 1H a first contact electrode 41 is formed on the semiconductor via region 11 in the region of the first surface 101 and a second contact electrode 42 is formed on the semiconductor via region 11 in the region of the second surface 102'. To form the first and second contact electrodes 41, 42 in the region of the first and second surfaces 101, 102, respectively, means that these electrodes 41, 42 can be formed on the respective surfaces 101, 102. However one or both of these trenches could also be formed in trenches, wherein each of these trenches extends from one of the surfaces 101, 102 into the via region and includes one of the first and second electrodes 41, 42 contacting the via region within the respective trench.

The first contact electrode 41 is, for example, a metal, a silicide, or a highly doped polycrystalline semiconductor material, such as polysilicon. Optionally, a doped contact region 13 is formed in the via region 11 below the first surface 101 before forming the first contact electrode 41. Such contact region can also be formed below the second surface 102' before forming the second contact electrode 42. However, such contact region can be omitted, when the semiconductor body has a high basic doping, like in the region of the higher doped first semiconductor layer 110.

Although the method steps for producing the semiconductor via 11 with the first and second contact electrodes 41, 42 have been illustrated in a certain order, the method is not restricted to perform these steps in any particular order. Rather, the order of method steps can be changed. For example, the first contact electrode 41 on the first surface 101 and the optional contact region 13 can be produced before the removal process, or even before producing the insulation trench 103.

Figure 5A:
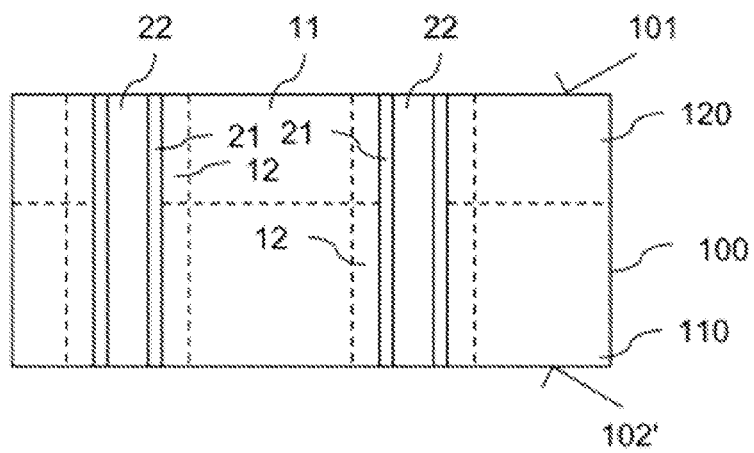
FIGS. 5A to 5C, illustrates vertical cross sections through a semiconductor body during method steps of a method according to a second embodiment.
Figure 5B:
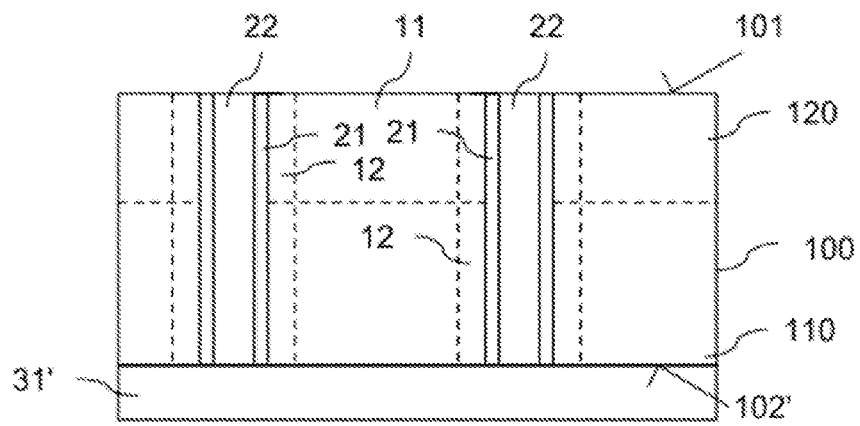
Figure 5C:
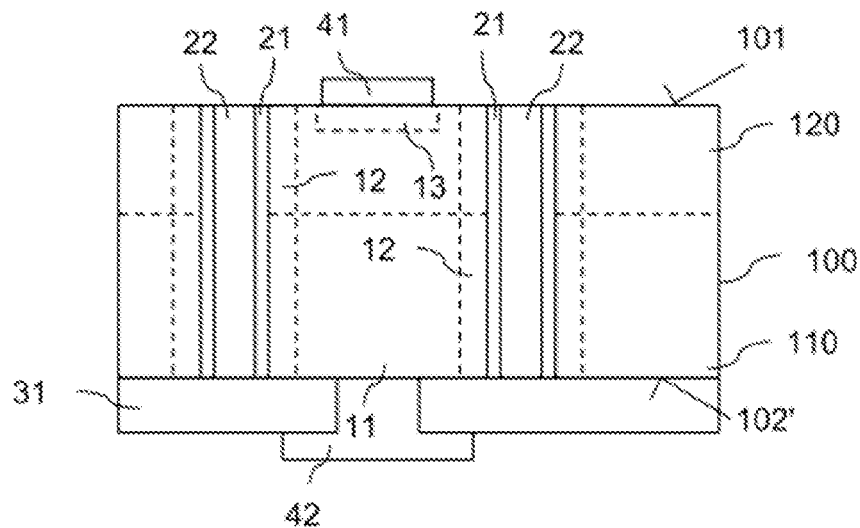

FIGS. 5A to 5C illustrate a further embodiment for producing a semiconductor via 11 in a semiconductor body 100. This method is basically equivalent to the method illustrated in FIGS. 1A to 1H with the difference that the second surface 102' is planarized at the end of or during the removal process so that the first insulation layer 21 in the bottom region of the insulation trench 103 is removed. FIG. 5A illustrates a vertical cross-section through the semiconductor body 100 after these method steps. After these method steps the first insulation layer 21 is present on opposite sidewalls of the insulation trench 103 and a filling material 22 is uncovered at the second surface 102'. Referring to the explanation provided herein above, the filling material 22 is optional. As such, the insulation trench 103 can be completely filled with the first insulation layer 21.

The method steps illustrated in FIGS. 5B and 5C for forming the second insulation layer 31 on the second surface 102', and for forming the first and second contact electrodes 41, 42 correspond to the method steps illustrated in FIGS. 1F to 1H to which reference is made, respectively. The second insulation layer 31 covers the insulation trench 103 at the second surface 102' and leaves a contact opening above the semiconductor via region 11.

The method steps illustrated in FIGS. 4, 5A and 5B may also be described as a method for producing a semiconductor component with several semiconductor mesas which are laterally insulated from each other by a first insulation layer 21 arranged on one or more insulation trenches $103_1$, $103_2$. The method includes: providing a semiconductor body 100 with a first surface 101 and a second surface 102 opposite to the first surface 102; etching one or more insulation trenches $103_1$, $103_2$ from the first surface 101 partially into the semiconductor body 100; forming a first insulation layer 21 on one or more sidewalls of the insulation trenches $103_1$, $103_2$; processing the second surface 102 by at least one of grinding, polishing, a CMP-process, chemical etching and plasma etching to expose the first insulation layer 21; and, depositing on the processed second surface 102' a second insulation layer 31' which extends to the first insulation layer 21.

In the exemplary embodiment illustrated in FIG. 5B, three semiconductor mesa regions are shown, which are insulated from each other by the first insulation layer 21 arranged on the sidewalls of the insulation trenches and by the second insulation layer 31' arranged on the back surface 102'. Later, the second insulation layer 31' may partially be removed to form a via region in the central semiconductor mesa as illustrated in FIG. 5C. In further embodiments, all or at least several semiconductor mesa regions of the final semiconductor component remain completely insulated on the back surface 102'. In these embodiments, the remaining sections 31 of the insulation layer 31' form the second insulation layer 31 which forms together with the first insulation layer 21 an insulating structure for the mutually insulated semiconductor mesas. Typically, the insulated semiconductor mesas include separated semiconductor structures forming at least parts of different electronic circuits. Accordingly, an integrated circuit with low cross-talk between the different electronic circuits and/or low leakage current may be provided. Further examples are explained below with regard to FIGS. 19 to 33. Such semiconductor components may also be manufactured by SOI-technology, however at higher costs. This is mainly due to the costs of SOI-wafers which are typically about four to ten times higher compared to similar wafers but without a buried oxide layer.

Referring to the explanation provided hereinabove, the first insulation trench 103 can be filled completely with the first insulation layer 21, where the first insulation layer 21 may also be produced as a stack of different material layers and may contain voids. A vertical cross-section through the semiconductor body 100 having the insulation trench 103 filled completely with the first insulation layer 21 is illustrated in FIG. 6. FIG. 6 shows a vertical cross section through the semiconductor body 100 before removing semiconductor material from the second surface 102 and before producing the first and second contact electrodes 41, 42.

The ohmic resistance of the semiconductor via region 11 between the first and second contact electrodes 41, 42 is, amongst others, dependent on the length of the via region 11, with the length corresponding to the vertical thickness of the semiconductor body 100, the area of the horizontal cross-section of the semiconductor via region 11, and the doping concentration of the via region 11. The ohmic resistance of the semiconductor via region 11 can be reduced by providing the higher doped regions 12 along the sidewalls of the insulation trench 103.

According to a further embodiment, the ohmic resistance of the semiconductor via region 11 can be reduced by additionally providing a contact trench filled with an electrically conductive material within the semiconductor via region 11. Such contact trench can be provided optionally or additionally to the higher doped semiconductor region 12. An embodiment of a method for producing a semiconductor via region 11 with a contact trench is explained next with reference to FIGS. 7A to 7E. These figures each show a vertical cross section through the semiconductor body 100 during particular steps of the method. Although these method steps are illustrated in a certain order in the figures, this order can be changed.

Figure 7A:
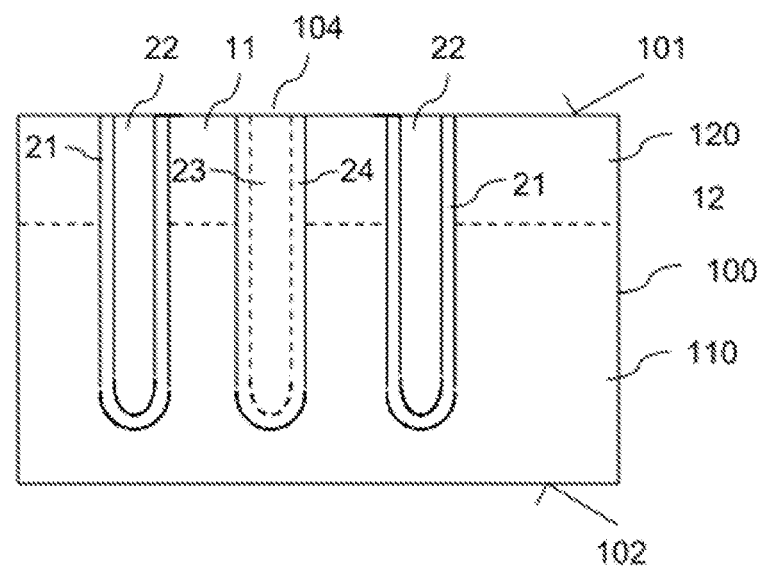
FIGS. 7A to 7E illustrates vertical cross sections through a semiconductor body during method steps of a method which, besides a semiconductor via, produces a further via in the semiconductor via region.
Figure 7B:
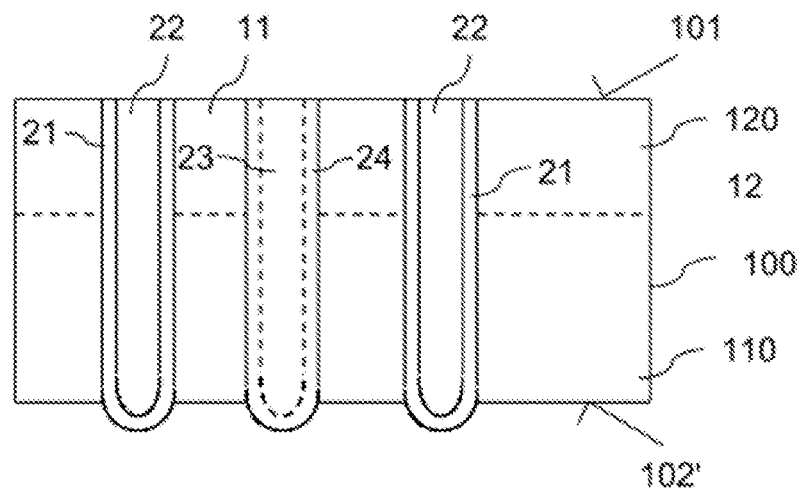
Figure 7C:
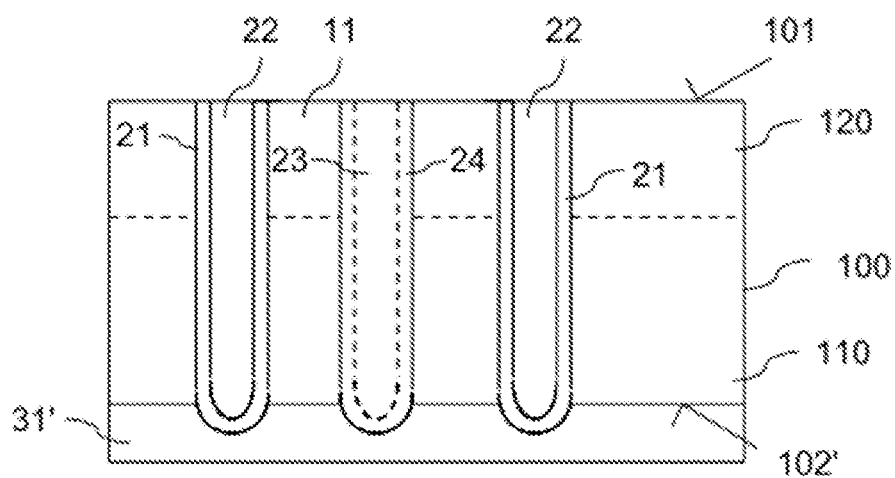
Figure 7D:
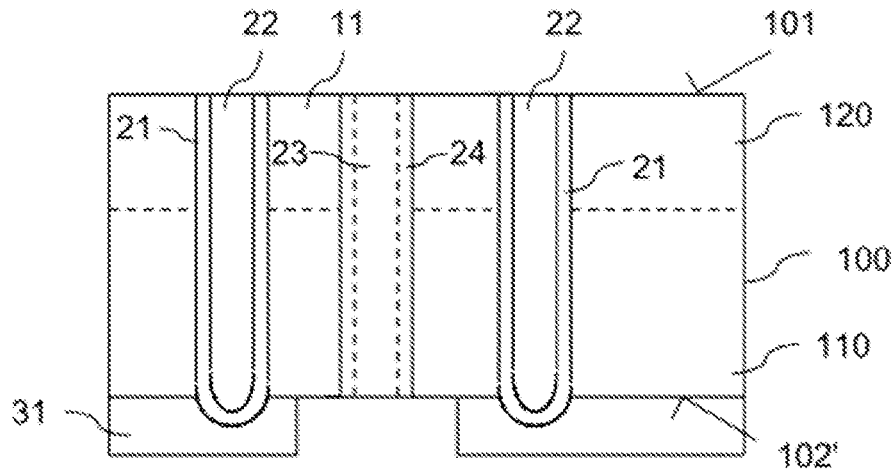

Referring to FIG. 7A this method involves, besides forming the insulation trench 103 and filling the insulation trench 103, forming a contact trench 104 which extends from the first surface 101 into the semiconductor body, and filling the contact trench 104 with an electrically conductive material 23. The electrically conductive material 23 is, for example, a doped amorphous or polycrystalline semiconductor material, such as polysilicon, a metal, a silicide, or carbon. According to one embodiment, the contact trench 104 is filled with a layer stack which includes at least two different electrically conductive layers. Optionally a diffusion barrier or a third insulation layer 24 is formed along the sidewalls of the contact trench 104 before filling the trench 104 with the electrically conductive material 23. The electrically conductive material 23 forms a conductive via within the semiconductor via region 11. The contact trench 104 can be produced such that it is arranged distant to the insulation trench 103. The position of the contact trench 104 within the semiconductor via region 11 is illustrated in dashed lines in the embodiments illustrated in FIGS. 2, 3 and 4.

The insulation trenches can include the first insulation layer 21 and an electrically conductive filling material 22, as illustrated in FIG. 7A. Alternatively, the insulation trench 103 can be completely filled with the first insulation layer 21 as illustrated in FIG. 6.

Figure 7E:
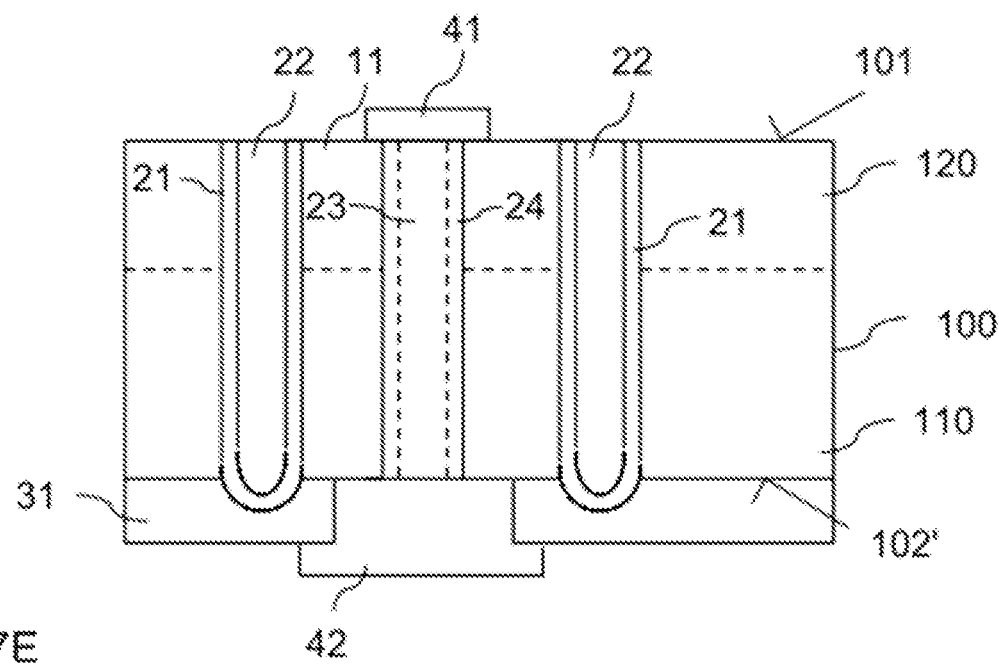

The remaining method steps illustrated in FIGS. 7B to 7E correspond to the method steps illustrated in FIGS. 1E to 1H, respectively. These method steps include partially removing the semiconductor body 100 at the second surface 102 (see FIG. 7B), forming the second insulation layer 31 adjacent to the first insulation layer 21 (see FIGS. 7C and 7D). The contact opening in the insulation layer 31' is formed such that the contact opening uncovers the contact via 23 at the second surface 102'. Referring to FIG. 7E, the first and second contact electrodes 41, 42 are formed on the contact via 23 and the semiconductor via 11 on the first surface 101 and on the second surface 102, respectively.

Forming the insulation trench 103 and the contact trench 104 may include common method steps. According to one embodiment these trenches 103, 104 are etched by the same etching process. Further, when the filling material 22 of the insulation trenches 103 is an electrically conductive material, the filling material 22 in the insulation trenches 103 and the electrically conductive material 23 in the contact trench 104 can be produced by the same method steps.

In the method illustrated in FIGS. 7A to 7E, the first insulation layer 21 at the bottom of the insulation trench 103 is preserved during the process of partially removing the semiconductor body 100 at the second surface 102. This is in correspondence with the method illustrated in FIGS. 1A to 1H.

According to one embodiment, the contact trench 104 is produced to extend deeper into the semiconductor body 100 from the first surface 101 than the insulation trenches 103. A deeper contact trench 104 can be produced using the same process that produces the insulation trenches 103 when the contact trench 104 is wider than the insulation trenches 103. After the contact trench 104 is filled with the electrically conductive material 23, and when the semiconductor material is removed from the second surface 102, the contact electrode 23 in the (deeper) contact trench 104 is uncovered before the insulation trenches 103 are reached. This allows to uncover the contact electrode 23 at the second surface 102' without removing the insulation layer 21 at the bottom of the insulation trenches 103.

Figure 8:
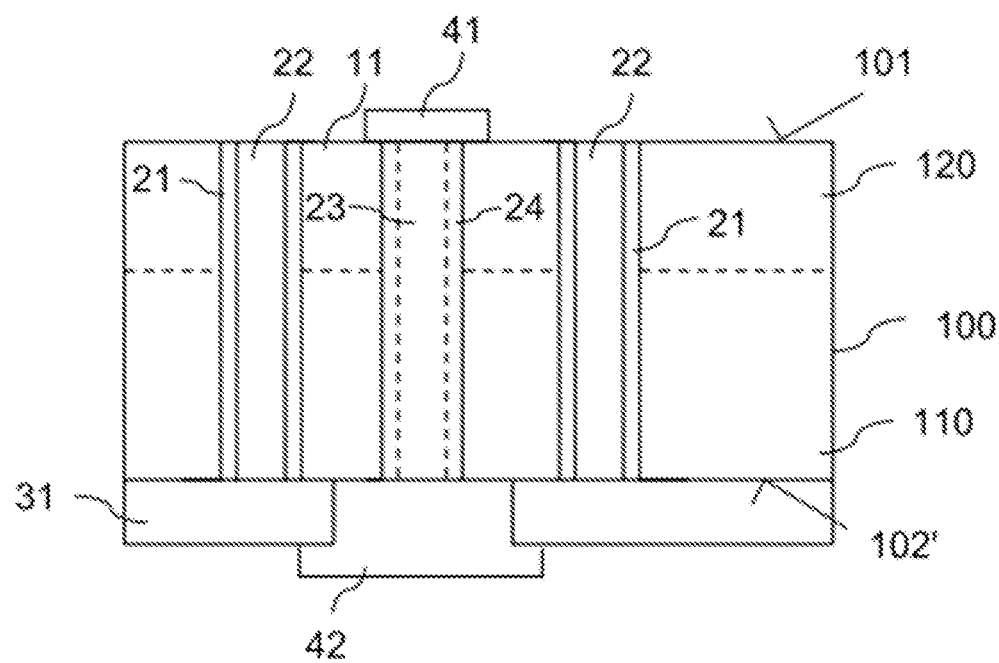
FIG. 8 illustrates a vertical cross section through a semiconductor component produced in accordance with a modification of the method according to FIG. 7.

However, similarly to the method illustrated in FIGS. 5A to 5C, the first insulation layer 21 can be partially removed at the bottom of the insulation trench 103 during the removal process, so that the filling material 22 is uncovered at the bottom of the trench 103, if there is a filling material 22 besides the first insulation layer 22. A semiconductor component produced in accordance with this modification is illustrated in FIG. 8.

Figure 9:
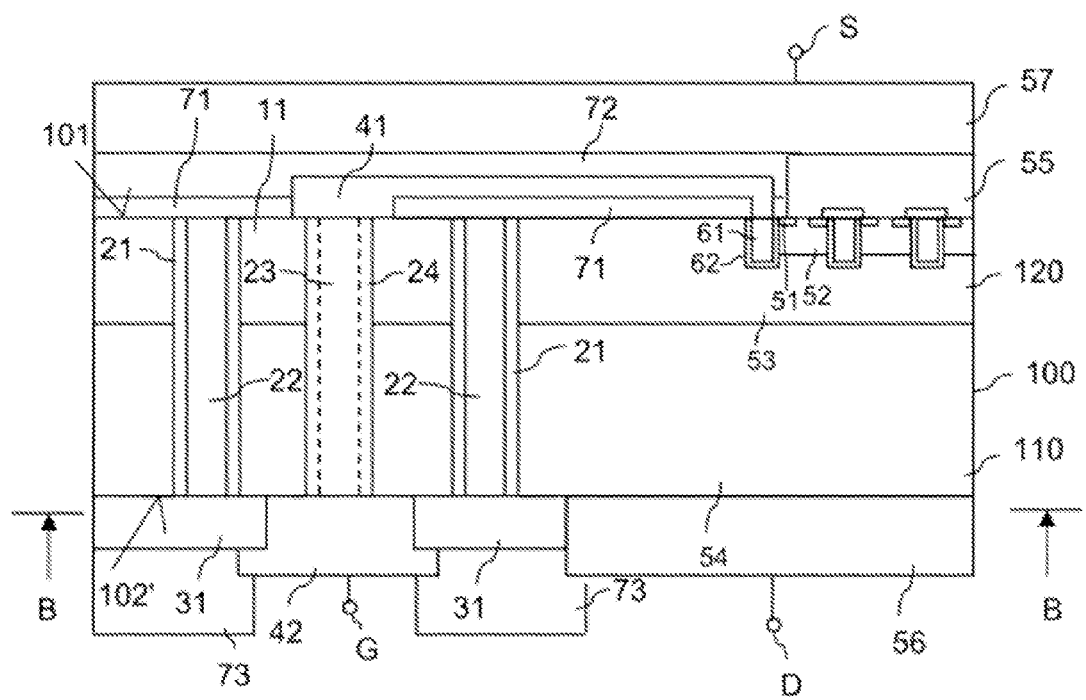
FIG. 9 illustrates a vertical cross section through a transistor component which includes a semiconductor via.

The semiconductor via region 11 and the optional contact via 23 can be used to connect any type of component region or device structure which is arranged in the region of the first surface 101 of the semiconductor body 100 with the second contact electrode 42 at the second surface 102'. FIG. 9 illustrates a vertical cross-section through a transistor, specifically a vertical MOS transistor. The MOS transistor is implemented in a semiconductor body 100 which includes a highly doped first semiconductor layer 110 and a lower doped second semiconductor layer 120. The MOS transistor includes a drain region 54 which is implemented by the first semiconductor layer 110 and which is contacted by a drain electrode 56 arranged on the second surface 102'. The drain electrode 56 forms a drain terminal D of the MOS transistor. The MOS transistor further includes a drift region 53 adjacent the drain region 54. The drift region 53 is formed by those sections of the first semiconductor layer 120 which have a basic doping of the second layer 120. The transistor further includes at least one transistor cell with a source region 51, a body region 52 arranged between the source region 52 and the drift region 53, and a gate electrode 61 arranged adjacent the body region 52 and dielectrically insulated from the body region 52 by a gate dielectric 62.

In FIG. 9, several transistor cells with a source region 51 and a body region 52 are illustrated. In the embodiment illustrated in FIG. 9, the gate electrode 61 is implemented as a trench-gate-electrode, which is a gate electrode arranged in a trench and extending from the first surface 101 into the semiconductor body 100. Implementing the gate electrode 61 as a trench-electrode, however, is only an example. The gate electrode 61 could also be implemented as a planar electrode, which is an electrode arranged above the first surface 101 of the semiconductor body 100. In FIG. 9, different sections of the gate electrode 61 are shown. These sections of the gate electrode 61 are electrically connected with each other in a manner not illustrated. For example, the gate electrode 61 has a grid-shaped geometry in the horizontal plane. Or, the individual sections 61 illustrated in FIG. 9 in a direction perpendicular to the section plane illustrated in FIG. 9 are longitudinal electrode sections. These longitudinal gate electrode sections can be electrically connected with each other by a connection arranged in a trench (not shown) which extends perpendicular to the gate electrode sections 61.

The gate electrode 61 is electrically connected to the first contact electrode 41, with the first contact electrode 41 dielectrically insulated by an insulation layer 71 from regions of the semiconductor body 100 which are outside the via region 11, and optionally from the trench filling material 22. Via the contact electrode 41 and the semiconductor via 11 the gate electrode 61 is electrically connected to the second contact electrode 42 arranged on the second surface 102'. In the following, the first contact electrode 41 is also referred to as a wiring. In the exemplary embodiment, only one wiring 41 is formed on the first surface 101.

Thus, a gate terminal G of the MOS-transistor is formed by the second contact electrode 42 arranged on the second surface 102' of the semiconductor body. The individual source regions 51 and the body regions 52 are electrically connected to a source electrode 55 which is dielectrically insulated from the gate electrode 61. The source electrode 55 is arranged on top of the first surface 101 of the semiconductor body. This vertical MOS transistor has its source electrode 55 above the first surface 101, and has its gate electrode 42 and its drain electrode 56 arranged on the second surface 102' of the semiconductor body.

The source electrode 55 is electrically connected to an electrode layer 57, like a metallization layer, which is arranged above the source electrode 55 and the gate contact electrode 41 and which is dielectrically insulated from the gate contact electrode 41 by a further dielectric layer 72. The electrode layer 57 forms an outer source electrode which, by virtue of its planar surface, can be mounted to a leadframe (not shown).

Alternatively a single layer metallization with a predominantly flat surface can be used and the gate contact electrode 41 can be made from a different material like highly doped polysilicon.

In this connection it should be mentioned that before producing the gate electrode 42 and the drain electrode 56 on the second surface 102' contact implantations can be made, which are implantations which serve to reduce the ohmic resistance between the via region 11 and the gate electrode 42 and between the drain region 54 and the drain electrode 56.

In the embodiment illustrated in FIG. 9, the drain region 54 is formed by a highly doped semiconductor layer 110, like a substrate, on which a lower doped layer 120, like an epitaxial layer, in which the drift region 53 is implemented is arranged. According to a further embodiment, the semiconductor body 100 has a basic doping which corresponds to the doping of the drift region 53. In this case, the drain region 54—and an optional field stop region in an IGBT—are formed by an implantation and/or diffusion and/or annealing process before producing the drain electrode 56. In this case, the vertical thickness of the semiconductor body 100 defines the length of the drift region 53.

Referring to FIG. 9, a passivation layer 73 can be formed on the second surface 102' or on the second insulation layer 31 (if a second insulation layer has been produced). The passivation layer 73 has contact openings above the gate electrode 41 and the drain electrode 56. As such, the gate electrode 42 and the drain electrode can be produced with the same method steps or can be part of one structured metallization layer.

The MOS transistor can be implemented as an n-type transistor or a p-type transistor. In an n-type transistor the source region 51 and the drift region 53 are n-doped, while the body region 52 region is p-doped. In a p-type transistor the source region 51 and the drift region 53 are p-doped, while the body region 52 is n-doped. The MOS-transistor can be implemented as a MOSFET or as an IGBT. In a MOSFET the drain region 54 has the same doping type as the source region 51, and in an IGBT the drain region 54 (which is also referred to as collector region) has a doping type which is complementary to the doping type of the source region 51.

The second contact electrode or gate electrode 42 and the drain electrode 56 can be arranged in many different ways on the second surface 102' of the semiconductor body 100. Three different embodiments are explained next with reference to FIGS. 10 to 12 each of which shows a horizontal cross-section through the second contact electrode 42 and the drain electrode 56 in a horizontal section plane B-B illustrated in FIG. 9.

Figure 10:
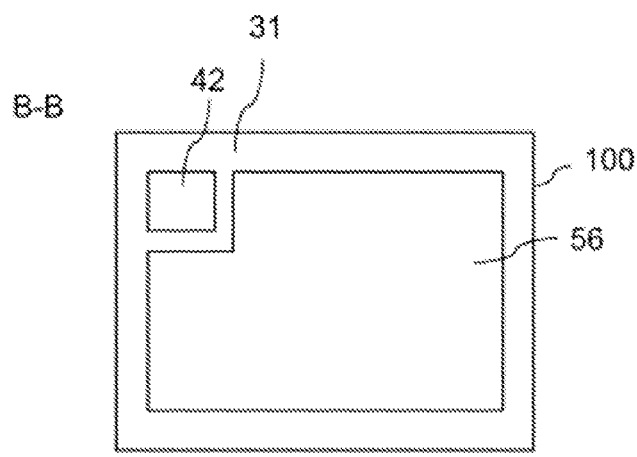
FIG. 10 illustrates a top view on one surface of a transistor component according to a first embodiment.

In the embodiment illustrated in FIG. 10, the drain electrode 56 and the gate electrode 52 are arranged next to each other, with the drain region 56 having a cut-out region in which the gate electrode 42 is arranged. The drain electrode 56 and the gate electrode 42 are electrically insulated from one another by the second insulation layer 31 and/or insulation layer 21.

Figure 11:
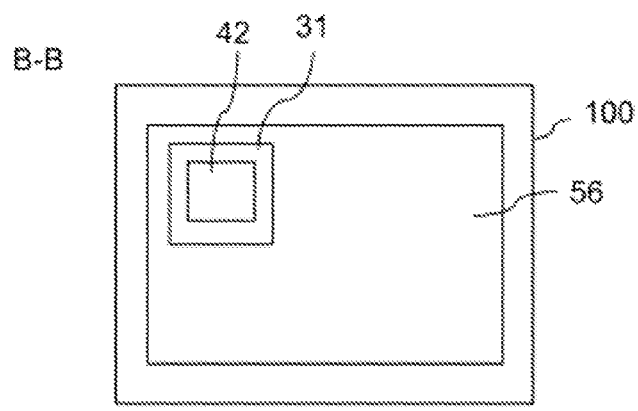
FIG. 11 illustrates a top view on one surface of a transistor component according to a second embodiment.

In the embodiment illustrated in FIG. 11, the gate electrode 42 is surrounded by the drain electrode 56, with the gate electrode 42 and the drain electrode 56 being electrically insulated from one another by the second insulation layer 31.

Figure 12:
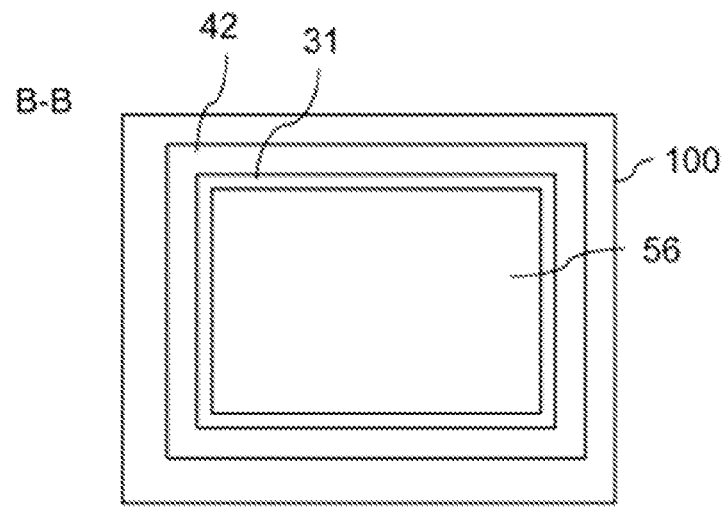
FIG. 12 illustrates a top view on one surface of a transistor component according to a third embodiment.

In the embodiment illustrated in FIG. 12, the gate electrode 42 surrounds the drain electrode 56, with these two electrodes 42, 56 being electrically insulated from one another by the second insulation layer 31 and/or insulation layer 21. In the embodiment according to FIG. 12 the gate electrode 42, like the semiconductor via region 11, has a ring-shaped geometry.

In other embodiments gate electrode 42 and via region 11 have different shapes. The drain electrode 56 can overlap with the via region 11. This requires however an insulation region between the gate electrode 42 and the drain regions as well as between the drain electrode 56 and the via region 11.

Figure 13:
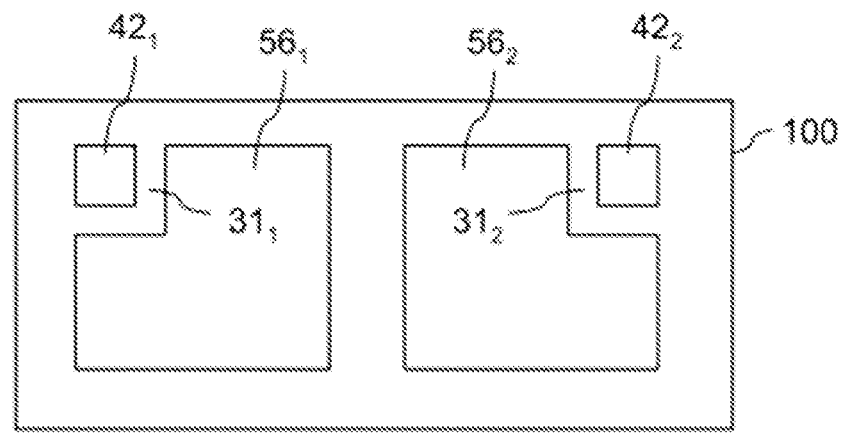
FIG. 13 illustrates a top view on one surface of a semiconductor body in which two transistor components, each including a semiconductor via, are integrated.
Figure 14:
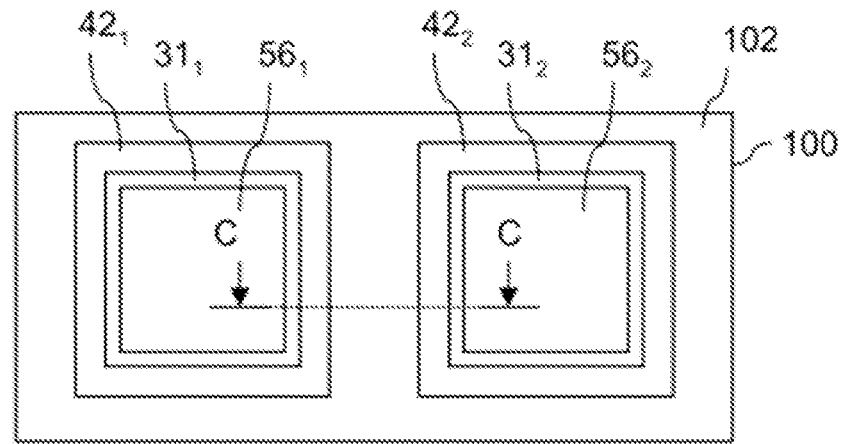
FIG. 14 illustrates a second embodiment of a semiconductor arrangement in which two transistor components, each including a semiconductor via, are integrated.

Two MOS-transistors can be implemented in a single semiconductor body. FIGS. 13 and 14 show horizontal cross-sections through gate electrodes and drain electrodes of two MOS-transistors implemented in one semiconductor body 100. In the embodiment illustrated in FIG. 13, a first gate electrode $42_1$ and a first drain electrode $56_1$ of a first MOS transistor are arranged next to each other and electrically insulated from one another by a second insulation layer $31_1$. Further, a second gate electrode $42_2$ and a second drain electrode $56_2$ of a second MOS transistor are arranged next to each other and electrically insulated from one another by a second insulation layer $31_2$. In addition one or more insulation trenches 103 can be provided between the drain electrodes $56_1$ and $56_2$ or surrounding one or both MOS-transistors to laterally insulate the drain and source potentials from one another. The source regions can be connected to a common source electrode or to electrically insulated source electrodes. Thus common source or common drain devices can be realized.

In the embodiment illustrated in FIG. 14, a first drain electrode $56_1$ is surrounded by a first gate electrode $42_1$ and a second drain electrode $56_2$ surrounded by a second gate electrode $42_2$, with the first and second gate electrodes $42_1$, $42_2$ being arranged distant from one another in a horizontal direction of the semiconductor body.

Figure 15:
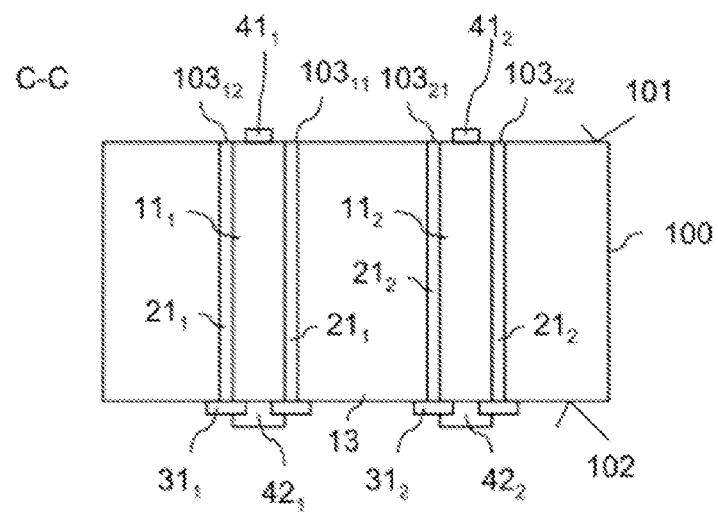
FIG. 15 illustrates a vertical cross-section through the component according to FIG. 14 in a section plane C-C.

FIG. 15 illustrates a vertical cross-section through the semiconductor body 100 of FIG. 14 in a vertical section plane C-C. In this vertical cross-section section of the first and second gate electrodes $42_1$, $42_2$, of the corresponding first contact electrodes $42_1$, $42_2$, and the semiconductor via regions $11_1$, $11_2$ are shown. Reference numerals $21_1$ and $21_2$ denote respective first insulation layers. In the embodiment illustrated in FIG. 15 the insulation trenches are completely filled with the first insulation layers $21_1$, $21_2$. However, this is only an example. These insulation trenches could also be implemented to be filled with the first insulation layer and a filling material e.g. as shown in FIG. 1D.

The first and second semiconductor vias $11_1$, $11_2$ illustrated in FIG. 15 are each produced (defined) by two insulation trenches $103_{11}$, $103_{12}$ and $103_{21}$, $103_{22}$, respectively. In a horizontal direction the first and second vias $11_1$, $11_2$ are separated from one another by two first insulation layers $21_1$, $21_2$ and a semiconductor region 13 arranged between the two first insulation layers $21_1$, $21_2$.

Figure 16:
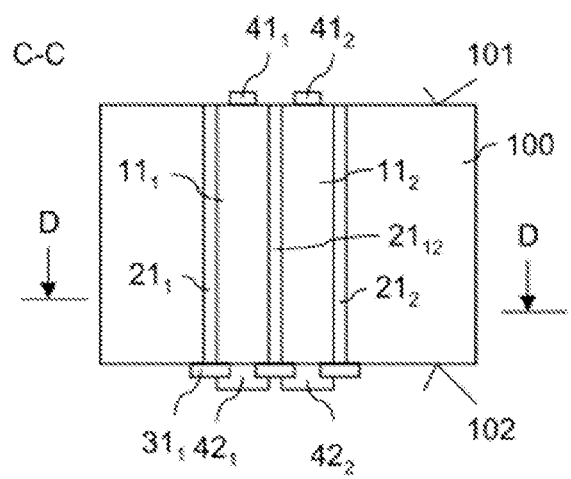
FIG. 16 illustrates a part of a vertical cross-section through a semiconductor body in which two transistor components are integrated.
Figure 17:
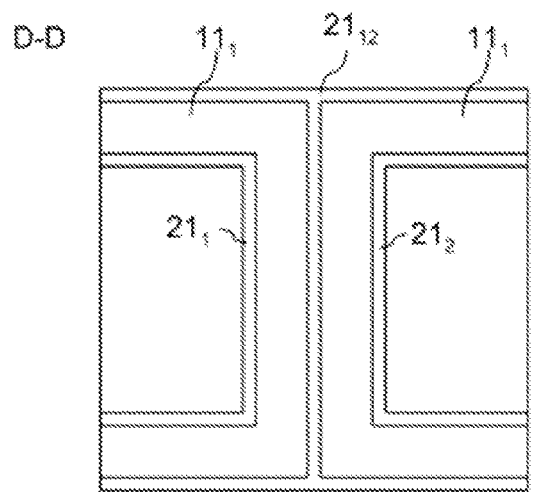
FIG. 17 illustrates a horizontal cross-section through the arrangement of FIG. 16.

FIG. 16 illustrates a further embodiment, in which the two semiconductor via regions $11_1$, $11_2$ are only separated by one insulation trench with a first insulation layer $21_{12}$. In this embodiment, the insulation trench between the semiconductor vias $11_1$, $11_2$ is completely filled with the insulation layer $21_{12}$. However, this is only an example, this insulation trench could also be filled with the first insulation layer $21_{12}$ and an additional filling material e.g. as shown in FIG. 1D. FIG. 17 illustrates a horizontal cross-section through the arrangement according to FIG. 16 in a horizontal section plane D-D.

Figure 18:
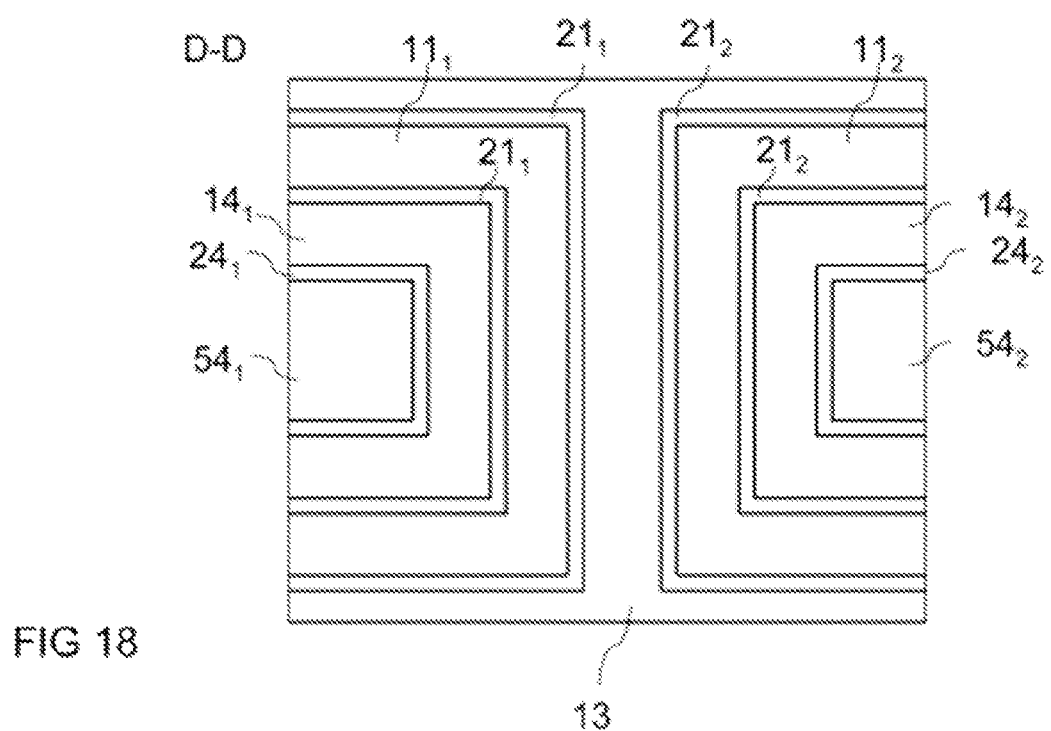
FIG. 18 illustrates a horizontal cross-section through a semiconductor body according to a further embodiment in which two transistor components are integrated.

FIG. 18 illustrates a further embodiment of a transistor arrangement with two MOS-transistors integrated in a semiconductor body 100. FIG. 18 illustrates a horizontal cross-section in a horizontal section plane through the gate electrode and the drain electrode. In this embodiment between the semiconductor via regions $11_1$ and $11_2$ a semiconductor region 13 is arranged, and between the semiconductor via regions $11_1$, $11_2$ and the drain electrodes or drain regions $54_1$, $54_2$ additional semiconductor regions $14_1$, $14_2$ are arranged, with the additional semiconductor regions $14_1$, $14_2$ being insulated from the drain regions $54_1$, $54_2$ by additional insulation trenches formed in correspondence with the insulation trenches $103_1$, $103_2$. These additional insulation trenches are filled with additional insulation layers $24_1$, $24_2$. Optionally, these additional insulation trenches are filled with the additional insulation layers $24_1$, $24_2$ and a filling material, like the insulation trenches 103 illustrated in FIG. 1D. In this embodiment, the additional semiconductor regions $14_1$, $14_2$ separate the via regions $11_1$, $11_2$ from the drain regions.

According to one embodiment, the semiconductor region 13 and the semiconductor regions 14 are connected to terminals for a defined electrical potential, such as ground or source potential, wherein source potential is the electrical potential of the source electrode 55. Thereby the capacitive coupling between the gates of the two transistors or between gate and drain of one transistor is significantly reduced.

With regard to FIGS. 19 to 27 further embodiments of a method for producing a semiconductor component 1000 with at least laterally insulated semiconductor mesas is illustrated. These figures show vertical cross-sections through a semiconductor body 100 during or after particular method steps.

Figure 19:
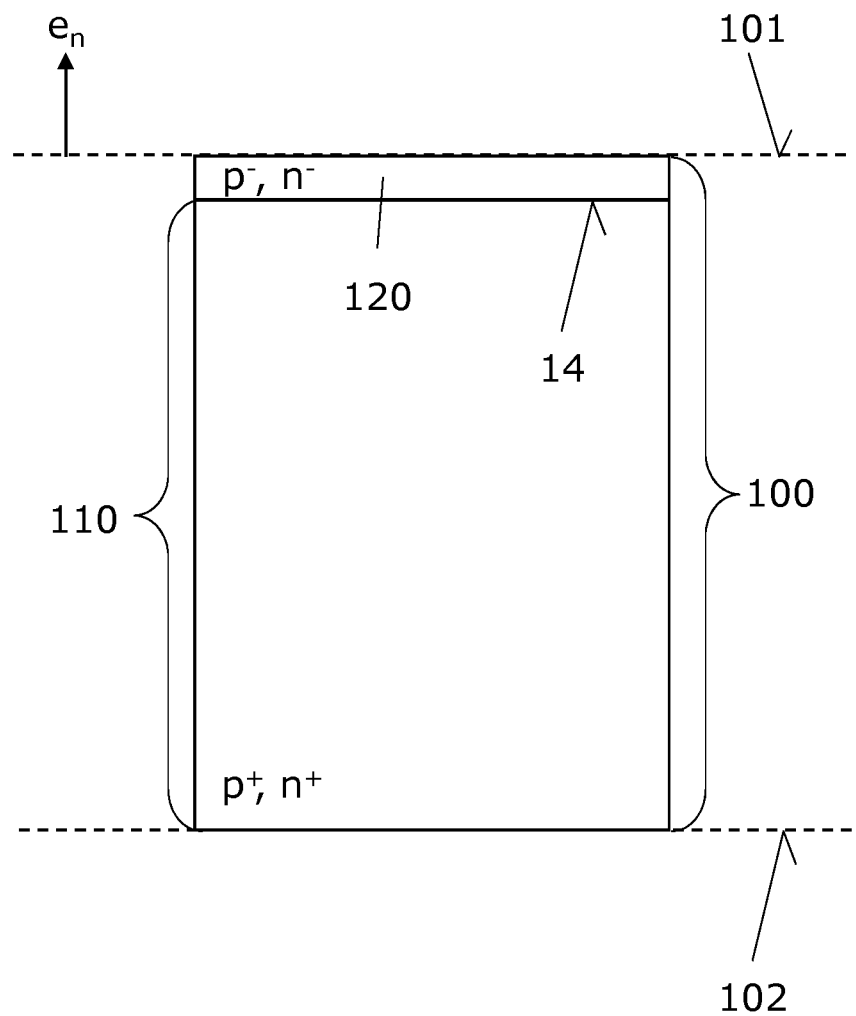
FIGS. 19 to 27 illustrate vertical cross-sections through a semiconductor body during method steps of a method according to further embodiments.

Referring to FIG. 19, a semiconductor body 100 is provided. The semiconductor body 100 includes a first surface 101 and a second surface 102 which is opposite to the first surface 101.

According to an embodiment, the semiconductor body 100 includes two differently doped semiconductor layers: a first semiconductor layer 110; and a second semiconductor layer 120 on top of the first semiconductor layer 110. The first semiconductor layer 110 is, for example, a semiconductor substrate, and the second semiconductor layer 120 is, for example, formed by the illustrated one or by more epitaxial layers 2 grown on the substrate 110 and over each other, respectively. The two semiconductor layers 110, 120 can have different doping concentrations and/or doping types as explained above with regard to FIG. 1A. The doping types of the dopings of the first and second layers 110, 120 can be identical or can be complementary so that a substantially horizontal pn-junction 14 is formed between the first layer 110 and the second layer 120. Alternatively, the semiconductor body 100 may have a homogeneous basic doping. In the exemplary embodiment, the first semiconductor layer 110 is higher doped than the second semiconductor layer 120.

Figure 20:
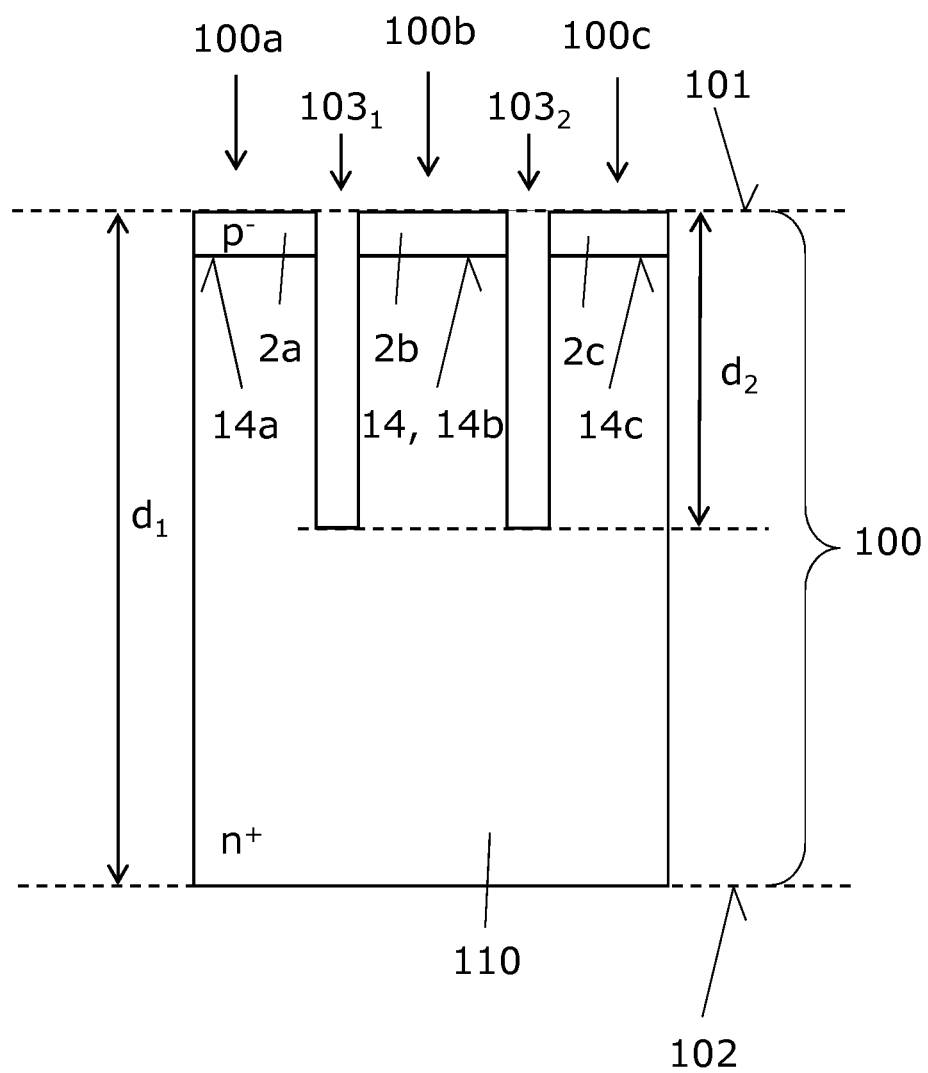

Referring to FIG. 20, at least one insulation trench 103$_1$, 103$_2$ is formed which extends into the semiconductor body 100 from the first surface 101. Typically, insulation trenches 103$_1$, 103$_2$ are etched into the semiconductor body 100, for example using a Bosch process.

In a horizontal plane, the at least one insulation trench 103$_1$, 103$_2$ can be implemented in many different ways, i.e. with many different geometries. The illustrated insulation trenches 103$_1$, 103$_2$ may be substantially ring-shaped as explained above with reference to embodiments illustrated in FIGS. 2 to 4. Accordingly, two insulation trenches 103$_1$, 103$_2$ which are separated from each other in vertical cross-sections may correspond to portions of one connected insulation trench 103$_1$, 103$_2$.

Note that the shown vertical cross-section typically corresponds only to a section through the semiconductor body 100. The semiconductor component 1000 may include a plurality of insulation trenches 103$_1$, 103$_2$ defining in the horizontal plane an array of semiconductor mesa regions 100a, 100b, and 100c in the semiconductor body 100. The array may, at least in a horizontal area, be regular. In other embodiments, the semiconductor mesa regions 100a, 100b, 100c are, in the horizontal plane, differently shaped and/or sized depending on the semiconductor structures to be formed therein.

As illustrated in FIG. 20, the insulation trenches 103$_1$, 103$_2$ typically extend completely through the epitaxial layer 120 and partially into the substrate 110. Accordingly, the epitaxial layer 120 is, at least in the shown vertical cross-section, subdivided in different portions 2a, 2b, and 2c. When the shown insulation trenches 103$_1$, 103$_2$ correspond to portions of a single insulation trench 103$_1$, 103$_2$, the portions 2a, 2c of epitaxial layer 120 are typically also connected.

In the exemplary embodiment, each semiconductor mesa regions 100a, 100b, 100c includes a portion 14a, 14b, 14c, of the pn-junction 14. The pn-junctions 14a, 14b, 14c may, for example, form a part of a respective diode structure or a transistor structures in the final semiconductor component 1000.

In particular insulation trenches 103$_1$, 103$_2$ of high aspect ratio may be formed differently. In a first step a wide trench that extends, in horizontal direction of the shown vertical cross-section, substantially between the outer side walls of the shown insulation trenches 103$_1$, 103$_2$ may be etched using an etching mask, for example a photoresist, a silicon oxide or silicon nitride hard mask. Thereafter, an oxide layer may be formed on the side walls of the wide trench. This is typically done by thermal oxidation and anisotropic etching to remove the thermal oxide formed at the bottom wall of the wide trench as well as at the first surface 101 while leaving a part of the hard mask on the first surface 101. The width of the oxide layer and the thermal oxide on the side wall of the wide trench substantially matches the desired width or about half of the desired width of the shown insulation trenches 103$_1$, 103$_2$. Thereafter, the wide trench is filled with semiconductor material using selective epitaxy. Any semiconductor material protruding out of the first surface 101 is typically removed, for example by a CMP-process. The etching mask and/or the oxide layer may now be removed. This process sequence results also in a structure as shown in FIG. 20.

As explained above with regard to FIGS. 1E and 5A, the semiconductor body 100 is later to be thinned at the second surface 102 at least to the insulation trenches 103$_1$, 103$_2$ to form separated semiconductor mesa regions 100a, 100b, 100c. Accordingly, the insulation trenches 103$_1$, 103$_2$ are typically etched to a vertical depth $d_2$ which is larger by about 5% to about 30%, more typically by about 15% to about 25% than the final vertical thickness of the semiconductor body 100. The final vertical thickness of semiconductor body 100 may be smaller than 100 µm or even smaller than 50 µm. Wafer of such vertical extension are typically to be supported during processing. Therefore, the vertical extension $d_1$ of semiconductor body 100 prior to thinning is typically larger, for example larger than about 250 µm. The vertical extension $d_1$ of semiconductor body 100 prior to thinning may, for example, be about 700 µm.

Figure 21:
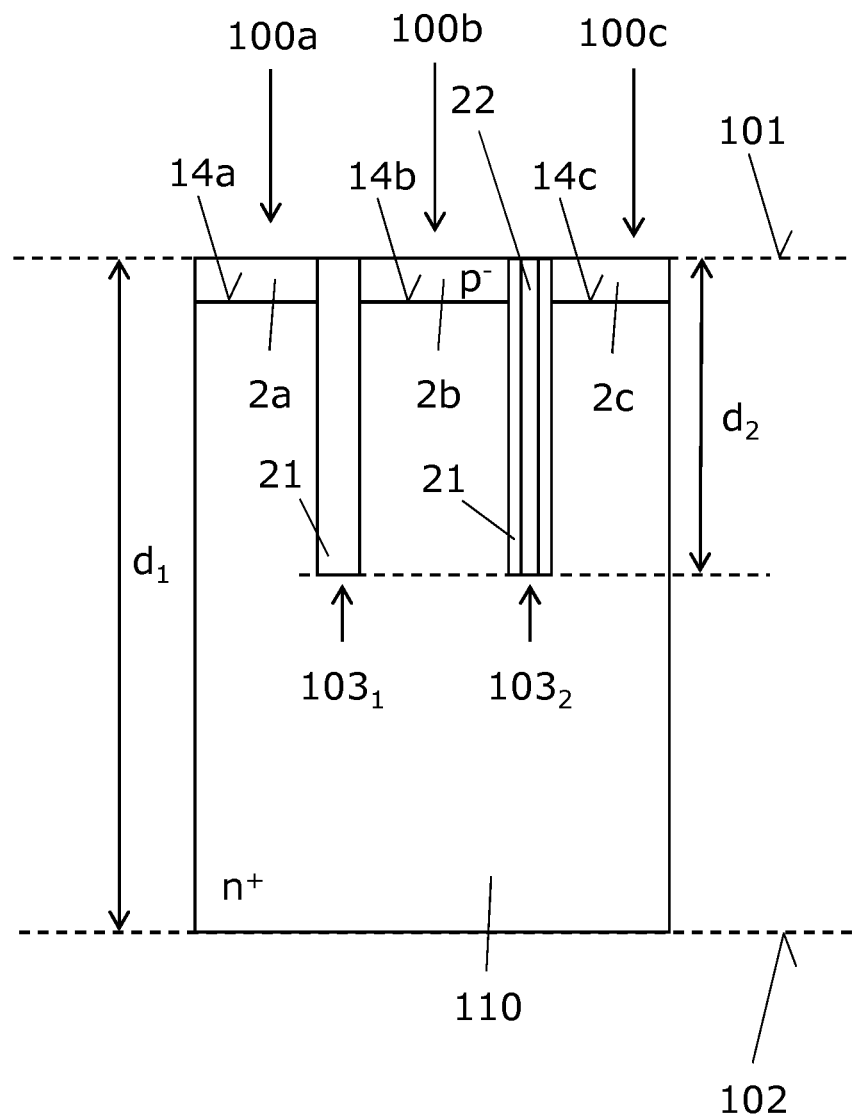

Thereafter, a first insulation layer 21 is formed at least on one sidewall of the insulation trenches 103$_1$, 103$_2$, typically on all sidewalls of the insulation trenches 103$_1$, 103$_2$. The resulting semiconductor component 1000 is illustrated in FIG. 21.

In the exemplary embodiment, the insulation trench 103$_1$ is completely filled with the first insulation layer 21 while the first insulation layer 21 only covers the sidewalls of insulation trench 103$_2$. This is, however, only an example. Typically, the insulation trenches 103$_1$, 103$_2$ of semiconductor component 1000 are formed in common processes to reduce processing complexity. Accordingly, the insulation trenches 103$_1$, 103$_2$ of the semiconductor component 1000 may have the same structure.

The inner part of in insulation trench 103$_2$, i.e. the residual trench, is filled with a filling material 22 which may be an insulating material or an electrically conductive material as explained above, for example with respect to FIG. 1C, such as an amorphous or polycrystalline semiconductor material, for example polysilicon, a metal like copper or wolfram, a silicide, or carbon. Filling the inner part of insulation trench 103$_2$ with a material that is different to the material of the first insulation layer 21 may reduce mechanical stress. Thus, the risk of breaking semiconductor body 100 during further processing may be reduced.

The first insulation layer 21 may be formed by thermal oxidation, and/or by deposition and a subsequent planarization process. The filling material 22 is typically formed by deposition and a subsequent planarization process. This allows substantially cavity-free filling of the insulation trench 103$_2$. Accordingly, the risk of breaking semiconductor body 100 during further processing may be further reduced.

Figure 22:
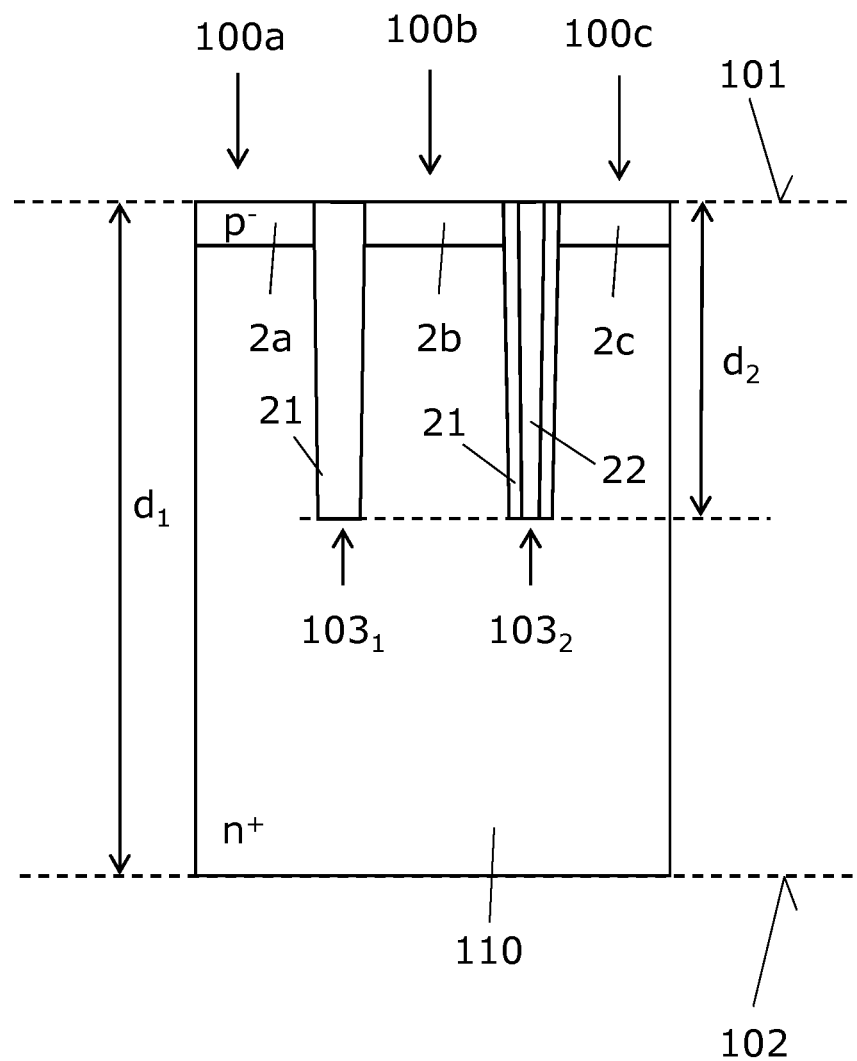

As illustrated in FIG. 22, the insulation trenches 103$_1$, 103$_2$ may be tapered. Accordingly, a horizontal extension of the insulation trenches 103$_1$, 103$_2$ may be smaller in a lower portion of the insulation trenches 103$_1$, 103$_2$ compared to a respective upper portion which is closer to the first surface 101. This may be achieved by a Bosch-process.

Depending on the functions of the semiconductor component 1000, several semiconductor regions or semiconductor zones such as source or emitter regions may additionally be formed from the first surface 101 in the portions 2a, 2b, and 2c of epitaxial layer 120. In or on each semiconductor mesa region 100a, 100b, and 100c an active and/or passive electric component such as a resistor, a capacitor, a diode and a transistor or even a complete circuitry may be formed. For example a MOSFET-structure may be formed in at least one of the semiconductor mesas 100a, 100b, and 100c. Beside additional semiconductor zones, an insulated gate electrode structure on the first surface 101 or in a trench extending form the first surface 101 into respective semiconductor mesa 100a, 100b, 100c may be formed. For sake of clarity, these structures are not illustrated in FIG. 22.

Figure 23:
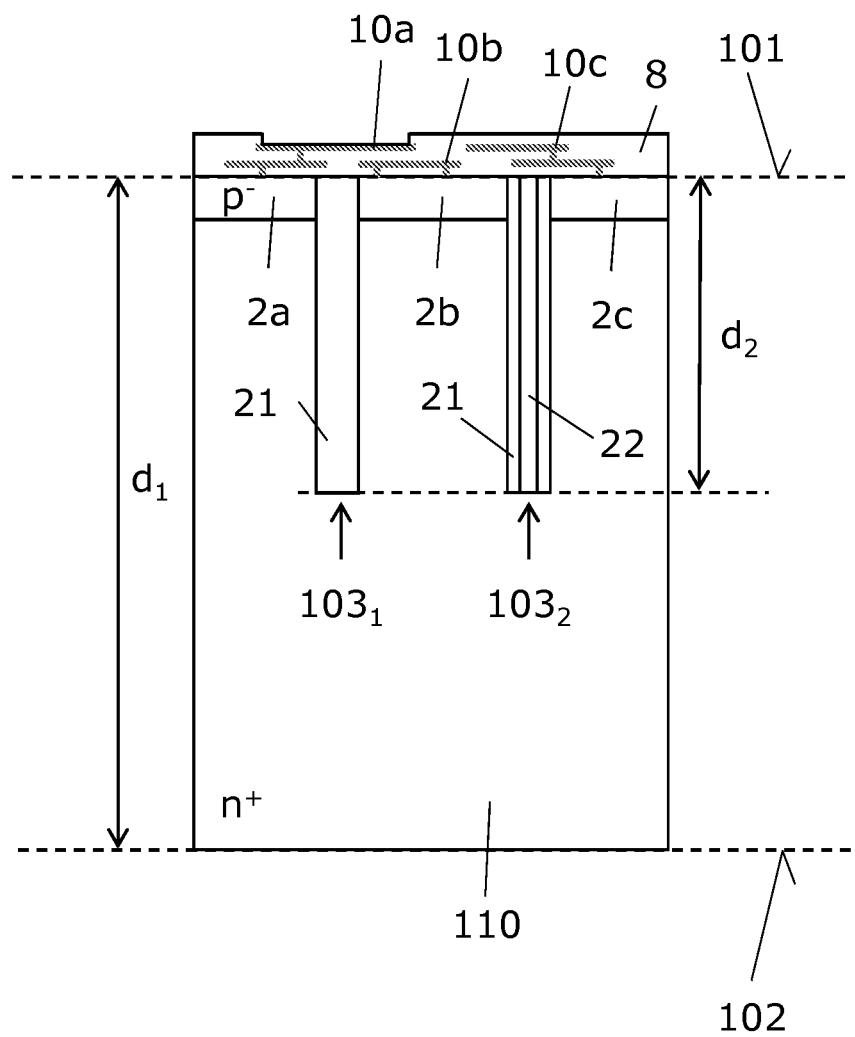

Thereafter, an interlayer dielectric 8, for example a phosphosilicate glass (PSG) layer, with conductive through contacts 10a, 10b, 10c in contact with at least some of the semiconductor zones are formed on the first surface 101. The resulting semiconductor component 1000 is illustrated in FIG. 23.

Furthermore, a wiring (not shown in FIG. 23) between at least two of the semiconductor mesas 100a, 100b, 100c may be formed on the first surface 101.

Thereafter, at least one metallization or terminal 55 may be formed on the first surface 101 to contact the electric components and circuits, respectively, formed in the semiconductor mesas 100a, 100b and 100c. The resulting semiconductor component 1000 is illustrated in FIG. 24.

Figure 24:
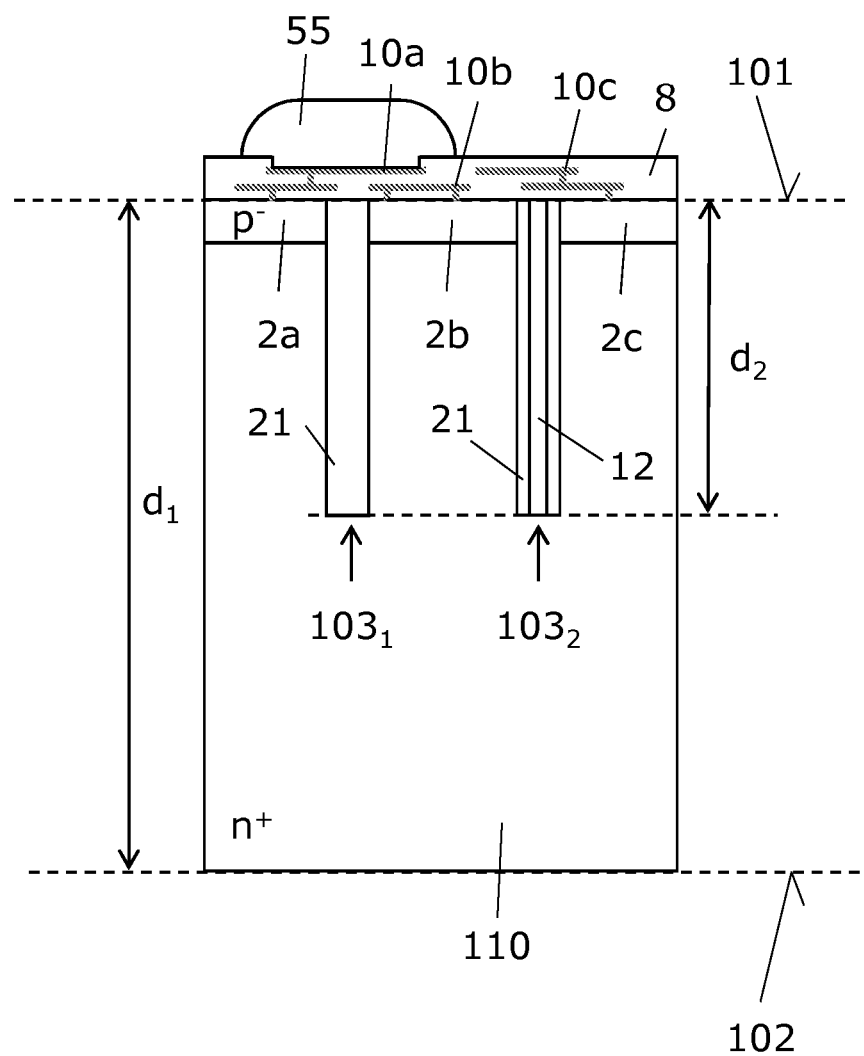

For sake of clarity, only one metallization 55, forming for example a source metallization for a transistor structure and/or an emitter metallization for an IGBT-structure and/or a diode structure, is illustrated in FIG. 24. Depending on function of the final semiconductor component 1000, several metallizations may be arranged on the first surface 101. For example, a drain metallization and a gate metallization may additionally be arranged on the first surface 101. In other embodiments, the drain metallization and/or a gate metallization are later arranged opposite to the source metallization 55. In these embodiments, a via region through the semiconductor body may additionally be provided for contacting gate electrodes formed next to the first surface 101 to the gate metallization formed opposite to the first surface 101, as explained above with regard to FIGS. 1 to 18. In yet other embodiments additional via regions through the semiconductor body may be provided to connect other electrodes to additional metallizations on a back surface 102' to be formed. Now, processing of semiconductor component 1000 from the first surface 101 is typically finished.

For thinning and further backside processing, the semiconductor body 100 is thereafter typically mounted with the first surface 101 on a carrier system 60, for example glued to a glass substrate or glass wafer 60. If the final thickness of the semiconductor body 100 is larger than about 200 μm, the semiconductor body 100 may also be mounted on a foil or even further processed without any carrier system.

Figure 25:
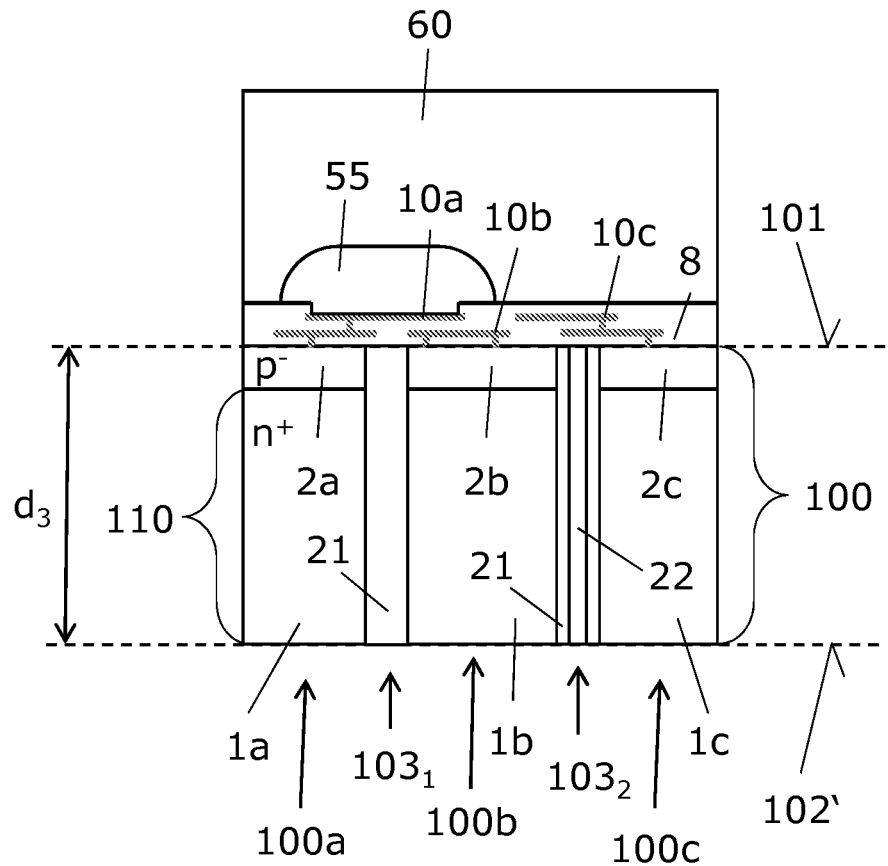

Thereafter, semiconductor material of the semiconductor body 100 is removed from the second surface 102 to expose bottom portions of the first insulation layer 21 and the insulation trenches 103$_1$, 103$_2$, respectively, and to form a back surface 102'. Accordingly, semiconductor mesas 100a, 100b, 100c are formed which are, at least in the vertical cross-section, separated from each other and laterally insulated from each other by the insulation trenches 103$_1$, 103$_2$, and the first insulation layer 21, respectively. The resulting semiconductor component 1000 is illustrated in FIG. 25. In the exemplary embodiment, each of the semiconductor mesas 100a, 100b, 100c include a portion 2a, 2b and 2c, respectively, of epitaxial layer 120 and a respective adjoining portion 1a, 1b, 1c of the substrate 110.

By removing semiconductor material of the semiconductor body, the semiconductor body 100 is thinned to a final vertical thickness $d_3$ between the first surface 101 and the back surface 102'. A lowermost portion of the insulation trenches 103$_1$, 103$_2$ may be removed during this process. For example, the final vertical thickness $d_3$ may be about 5% to 30%, more typically about 15% to about 25% smaller than the vertical etching depth $d_2$ of the insulation trenches 103$_1$, 103$_2$.

According to an embodiment, the semiconductor body 100 is thinned to a vertical thickness $d_3$ between the first surface 101 and the back surface 102' of less than about 50 μm, for example to about 40 μm, by removing semiconductor material of the semiconductor body 100. When the semiconductor body 100 is attached to a sufficiently stable carrier system 60 such as a glass wafer, semiconductor components 1000 with very thin semiconductor body 100 can be fabricated. This is particularly interesting for low voltage applications.

Removing semiconductor material of semiconductor body 100 is typically achieved by a combination of mechanical thinning, for example grinding or polishing, a CMP-process, with chemical and/or plasma etching to achieve a sufficiently low surface roughness of back surface 102'. For example, a grinding-process is used to remove a larger portion of the semiconductor material. Thereafter, etching may be used to remove further semiconductor material of semiconductor body 100, for example a few microns, until the desired final vertical thickness $d_3$ of semiconductor body 100 is reached. The semiconductor material may be etched selectively to the first insulation layer 21 and/or the filling material 22. In this embodiment, the first insulation layer 21 and/or the filling material 22 may slightly protrude out of the back surface 102'.

According to an embodiment, removing semiconductor material of semiconductor body 100 is carried out such that the back surface 102' is substantially scratch-free. For example, the surface roughness of back surface 102' is typically below 50 nm, more typically below 10 nm, and even more typically below 1 nm. Accordingly, later depositions onto back surface 102' are facilitated.

According to still another embodiment, the removing semiconductor material of semiconductor body 100 is carried out such that the first insulation layer 21 and/or the filling material 22 are not exposed. In this embodiment a thin layer of semiconductor material covers the first insulation layer 21 and/or the filling material 22 after removing semiconductor material of semiconductor body 100. The thin layer may be completely oxidized in a later step.

Figure 26:
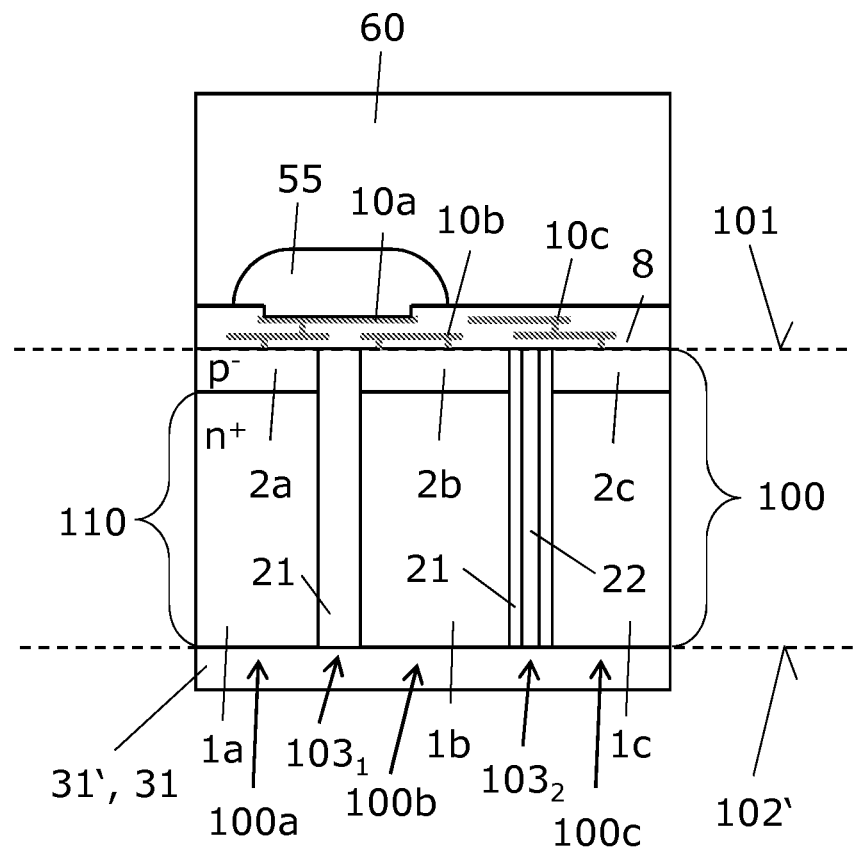

Referring to FIG. 26, a second insulation layer 31' is deposited on the back surface 102' such that the second insulation layer 31' extends to and adjoins, respectively, the first insulation layer 21. Accordingly, semiconductor mesas 100a, 100b, 100c are formed which are insulated from each other by the first insulation layer 21 and the second insulation layer 31'.

Typically, the second insulation layer 31' is mask-less deposited on the back surface 102'. Thus, the semiconductor mesas 100a, 100b, 100c are completely insulated on the back surface 102' by the second insulation layer 31'. In the exemplary embodiment, at least the central semiconductor mesas 100b is completely insulated on the sidewalls and on the back-surface 102' by an insulating structure formed by first insulation layer 21 on the sidewalls of the insulation trenches $103_1$, $103_2$ and by the second insulation layer 31'. This applies also to embodiments in which the first insulation layer 21 and/or the filling material 22 slightly protrude out of the back surface 102' after removing semiconductor material of semiconductor body 100. In these embodiments, the second insulation layer 31' is also formed on and in direct contact with the first insulation layer 21 and the filling material 22. In embodiments in which a thin layer of semiconductor material covers the first insulation layer 21 and the optional filling material 22 after removing semiconductor material of semiconductor body 100, the second insulation layer 31' is typically formed by anodic oxidation of the semiconductor material so that the second insulation layer 31' adjoins the first insulation layer 21 and the optional filling material 22.

The second insulation layer 31' may completely cover the back surface 102' in the finally produced semiconductor component as second insulation layer 31. Alternatively, the deposited second insulation layer 31' may later partly be recessed so that remaining sections 31 of the insulation layer 31' form the second insulation layer 31 in the finally produced semiconductor component. In both cases at least one of the semiconductor mesas 100a, 100b, 100c, for example the central semiconductor mesas 100b is at the back surface 102' completely covered by the second insulation layer 31 which adjoins the first insulating layer 21. Accordingly, the semiconductor structures formed in semiconductor mesa 100b are insulated from the neighboring semiconductor mesas 100a, 100c. This at least reduces leakage current and unwanted cross-talk between the semiconductor mesas 100a, 100b, and 100c. The processes explained with regard to FIGS. 19 to 26 may therefore be used to manufacture integrated circuits in which different functions are realized in insulated semiconductor mesas 100a, 100b, 100c or insulated semiconductor wells 100a, 100b, 100c.

Thereafter, a stabilizing layer 56', for example a metal layer, may be deposited on the second insulation layer 31. The resulting semiconductor component 1000 is illustrated in FIG. 27.

In the exemplary embodiment, the semiconductor structures formed in semiconductor mesa 100b are insulated from the neighboring semiconductor mesas 100a, 100c by an insulating structure formed by first insulation layer 21 on the sidewalls of the insulation trenches $103_1$, $103_2$ and by the second insulation layer 31. Accordingly, leakage current and unwanted cross-talk between the semiconductor mesas 100a, 100b, and 100c is at least reduced.

The semiconductor component 1000 may now be removed from the carrier system 60. Typically, a plurality of semiconductor component 1000 is formed in parallel on a common wafer, which may be cut into individual semiconductor bodies (chips) prior to or after removing the common wafer from the carrier system 60.

Figure 27:
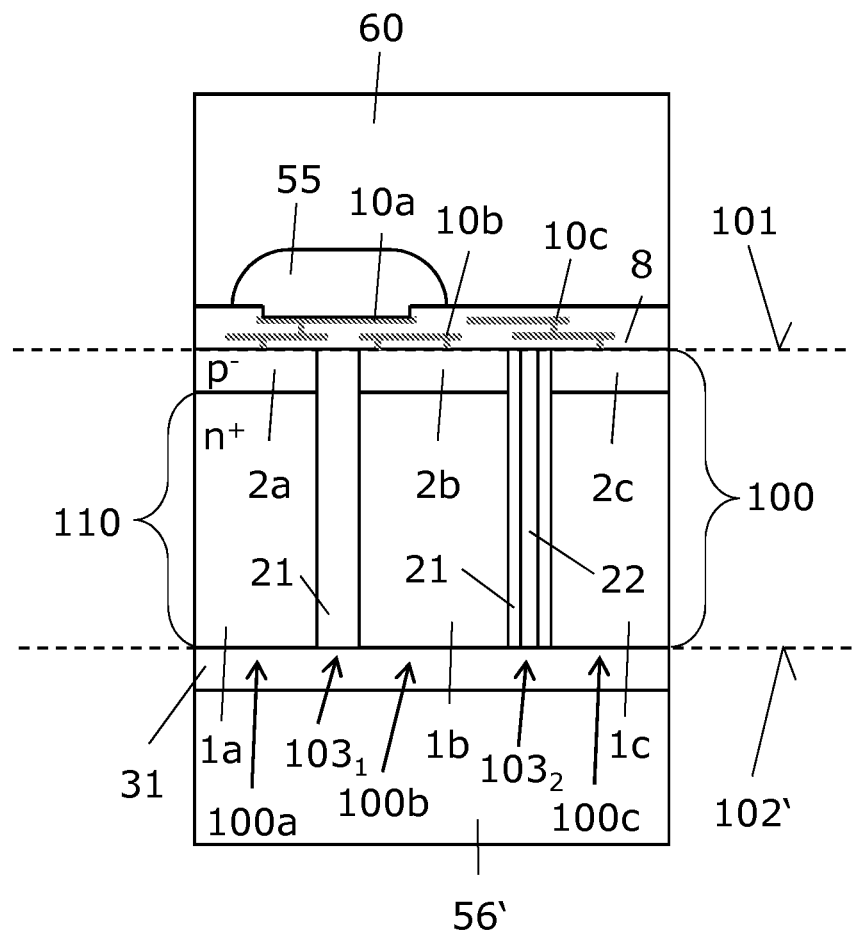

A similar semiconductor component as illustrated in FIGS. 26 and 27 may also by fabricated using SOI-technology. For example, deep vertical trenches may be etched to a buried oxide layer of a SOI-wafer and filled with a dielectric material. Accordingly, insulated wells may also be formed. However, this manufacturing method is more expensive due to the much higher price of SOI-wafers compared to normal wafers.

Furthermore, not only silicon oxide and sapphire used in SOI-technology may be used as material of the second insulation layer 31 in the methods explained herein. Depending on application and semiconductor material of the semiconductor body, the material of the second insulation layer 31 may be chosen according to mechanical and/or thermal criterions. For example, a dielectric material of high thermal conductivity such as aluminum nitride (AlN), diamond like-carbon or an organosilicate dielectric also known as C-doped oxide (CDO) or organosilicate glass (OSG), such as SiCOH may be used as material of the second insulation layer 31 to improve removal of excess heat from the semiconductor component 1000. Furthermore, it is possible to better adapt the thermal expansion coefficients of the semiconductor material and the material of the second insulation layer 31. Accordingly, thermal stress during operation of and/or soldering semiconductor component 1000 with its back side 102' to a lead frame is reduced. For example, aluminum nitride may be used as material of the second insulation layer 31 on a silicon semiconductor body 100 to achieve both high thermal conductance and low thermal stress at varying temperatures.

As already explained above with regard to FIGS. 1F and 1G, depositing the second insulation layer 31 is typically performed at comparatively low temperatures, like temperatures below 600° C. or even below 400° C. to protect structures already formed next to the first surface 101. Further suitable materials for low temperature forming of the second insulation layer 31 are boron-silicate glass, spin-on glass, silicone, a polymerized imide, a parylene or a polymerized benzocyclobutene, a cured resin, for example a cured epoxy resin such as SU8 or other synthetic materials. Of course, other standard dielectric materials of semiconductor technology such as silicon nitride may also be deposited as second insulation layer 31. Furthermore, the second insulation layer 31 may be formed by galvanic oxidation.

According to an embodiment, the produced semiconductor component 1000 includes a semiconductor body 100 with a first surface 101 and a back surface 102' opposite to the first surface 101, and at least one insulation trench $103_1$, $103_2$ formed in the semiconductor body 100. A first insulation layer 21 extends on at least one sidewall of the at least one insulation trench $103_1$, $103_2$ from the first surface 101 to the back surface 102'. A second insulation layer 31 is deposited on the back surface 102' and includes at least one of aluminum nitride, diamond like-carbon, boron-silicate glass, a spin-on glass, an organosilicate dielectric, a silicone, a polymerized imide, a parylene or a polymerized benzocyclobutene, and a cured resin or a another synthetic material. The second insulating layer 31 may also be an oxide, for example formed by anodic oxidation. At least two semiconductor mesas 100a, 100b, 100c are formed in the semiconductor body 100 which are laterally insulated from each other by the first insulation layer 21. At least one of the two semiconductor mesas 100a, 100b, 100c is completely insulated on the back surface 102' by the second insulation layer 31. Accordingly, a semiconductor component 1000, typically an IC, with low leakage current and low cross-talk between the semiconductor mesas 100a, 100b, and 100c is provided.

Typically, the at least one insulation trench $103_1$, $103_2$ is substantially void-free. For example, the first insulation layer 21 covers only the sidewalls of at least one insulation trench $103_1$, $103_2$ and the residual trench is filled with a different dielectric material or conductive material.

The semiconductor component 1000 typically forms an integrated circuit with a plurality of semiconductor mesas 100a, 100b, 100c which are insulated from each other by the second insulation layer 31 and first insulation layers 21 arranged in respective insulation trenches $103_1$, $103_2$ and at the sidewalls of the respective insulation trenches $103_1$, $103_2$, respectively. Further examples are explained below with regard to FIGS. 30 to 33.

Figure 28:
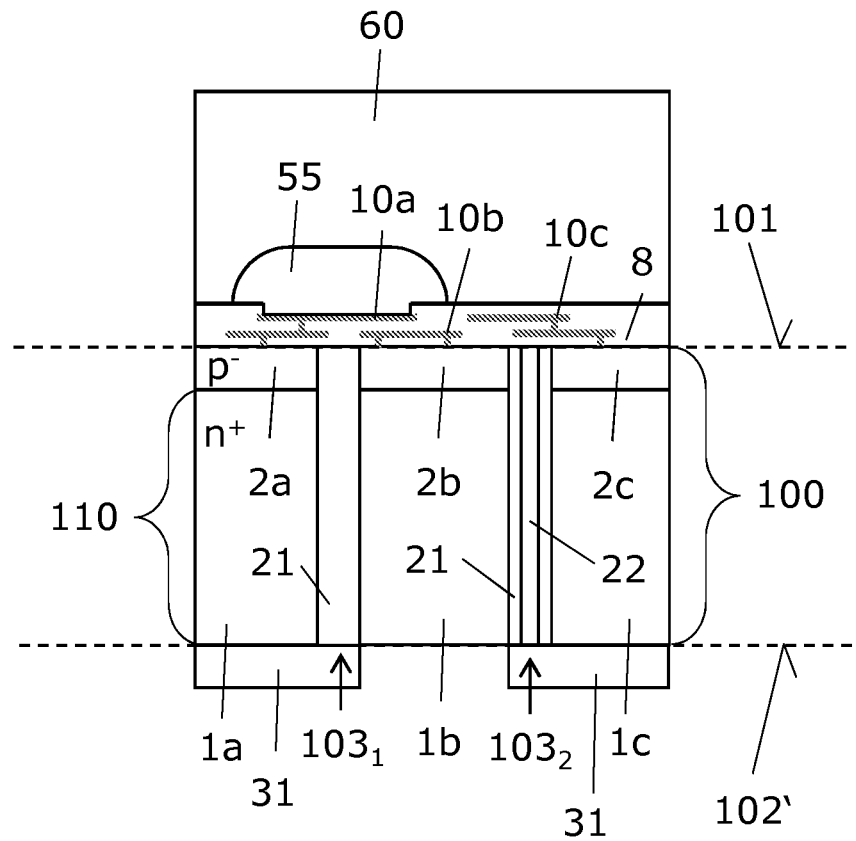
FIGS. 28 to 29 illustrate vertical cross-sections through a semiconductor body during method steps of a method according to still further embodiments.
Figure 29:
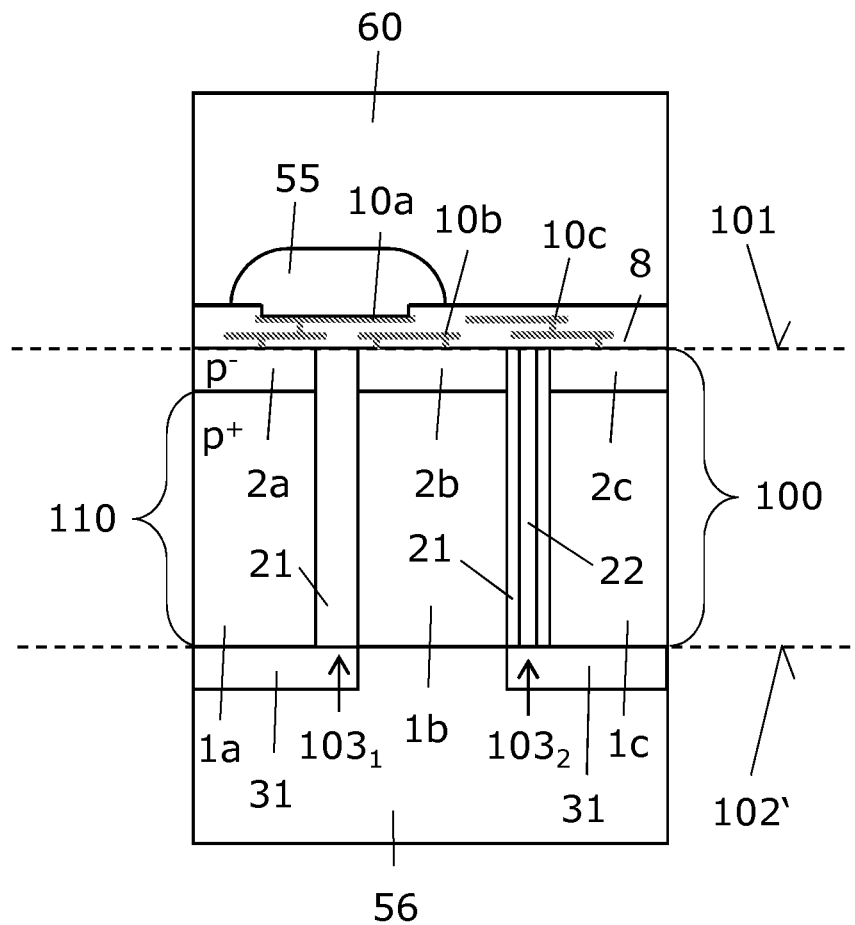

Referring to FIGS. 28 and 29, further embodiments for producing semiconductor components are explained. After depositing the second insulation layer 31 on back surface 102', as explained above with regard to FIG. 26, the second insulation layer 31 may be partially recessed to expose at least one of the semiconductor mesas 100a, 100b, and 100c on the back surface 102'. The resulting semiconductor component 1002 with exemplarily exposed semiconductor mesa 100b is illustrated in FIG. 28. Before or after formation of the second insulating layer 31, a contact or emitter implantation with e.g. P, As, Sb, B may be applied.

Thereafter, a metallization 56 may be formed on the back side 102' in ohmic contact with the exposed semiconductor mesa 100b. Accordingly, a backside contact 56 is formed. The resulting semiconductor component 1002 is illustrated in FIG. 29.

The backside contact 56 may, for example, form a drain electrode for a MOSFET-structure or a collector electrode for an IGBT-structure. Metallization 56 may be formed by deposition and may cover the back surface 102' completely. In other embodiments, metallization 56 is structured so that different contacts are formed on the back side 102'. For example, a gate electrode and a drain electrode may be formed on the back side 102' as explained above with regard to FIG. 9. When the insulation trench $103_2$ is filled with a conductive material 22, this filling may also be recessed on the back side 102' and used as a through contact between a gate metallization arranged on back side 102' and one or more gate electrodes arranged next to the first surface 101.

A similar semiconductor component as illustrated in FIG. 29 may also by fabricated using SOI-technology. For example, deep vertical trenches may be etched to a local buried oxide layer of a SOI-wafer and filled with a dielectric material. However, this manufacturing method is more expensive due to the comparatively high prices of SOI-wafer.

Figure 30:
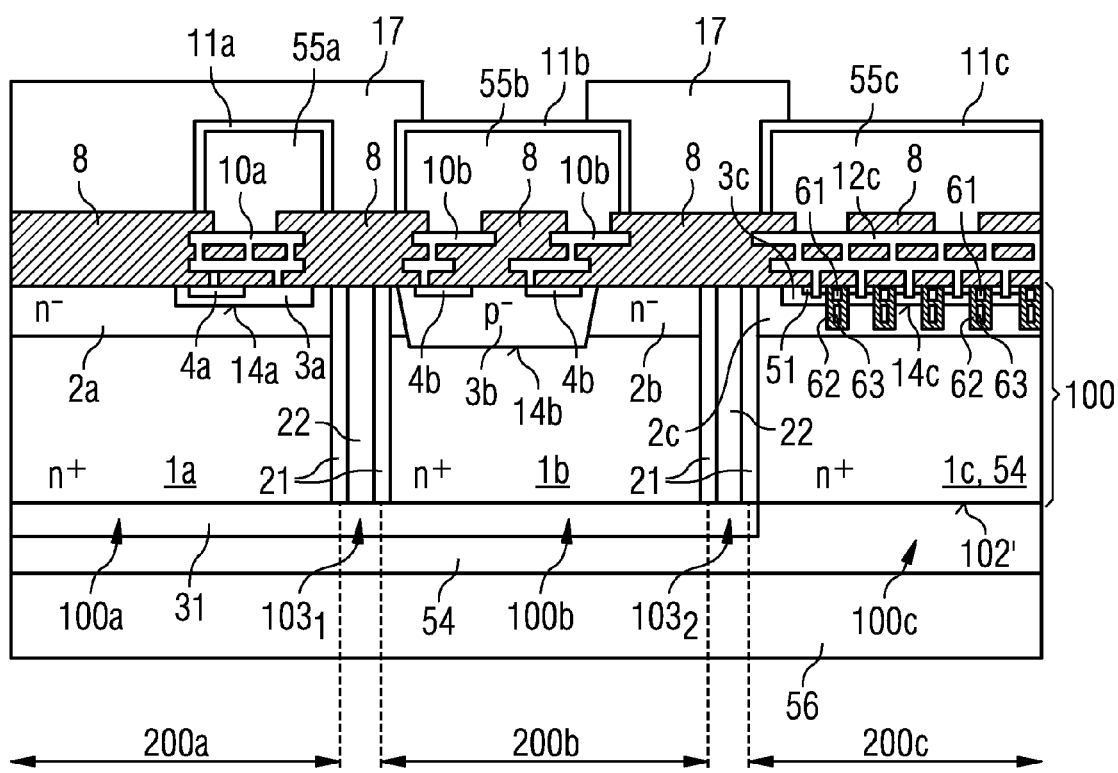
FIG. 30 illustrates a vertical cross-section through a semiconductor body of an integrated circuit with several semiconductor mesas, each including a respective electronic circuit, according to an embodiment.

Referring to FIG. 30, a further semiconductor component 2000 that may be produced with the methods explained herein is explained. Semiconductor component 2000 is similar to semiconductor component 1002 and also includes two insulation trenches $103_1$, $103_2$ and a second insulation layer 31 which is arranged on back surface 102' and partially recessed. The insulation trenches $103_1$, $103_2$ and the second insulation layer 31 form an insulating structure which insulates semiconductor mesas 100a, 100b, 100c from each other. However, the vertical cross-section through the semiconductor body 100 of semiconductor component 2000 is more detailed.

Due to the insulating structure, three different circuits which are electrically decoupled are formed in respective parts 200a, 200b, 200c and semiconductor mesas 100a, 100b, 100c, respectively, of semiconductor component 2000. In the exemplary embodiment, only the semiconductor mesa 100c is in ohmic contact with back-side metallization 56 forming a metallization of a power n-MOSFET formed in part 200c. Back-side metallization 56 may be made of copper (Cu) which is in contact with a drain region 54 formed by a lower portion 1c of semiconductor mesa 100c via an optional contact and barrier layer 54 made of, for example, aluminum, titanium or silver. Several gate electrodes 61 and field plates 63 are arranged in vertical trenches extending from the first surface 101 into semiconductor mesa 100c. The gate electrodes 61 and field plates 63 are insulated from an n-type drift region 2c, a p-type body region 3c and $n^+$-type source regions 51 by a gate and field dielectric 62. On the first surface 101 an interlayer dielectric 8 is arranged with through contacts 12c connecting source and body regions 51, 3c to a source electrode 55c or source terminal 55c formed by a source metallization 55c on interlayer dielectric 8. Source metallization 55c may also be made of copper and may be covered with a protective layer 11c of, for example NiP. For sake of clarity, a gate metallization of the MOSFET is not shown in FIG. 30.

Typically, semiconductor component 2000 forms an IC which includes further circuits in the parts 200a and 200b. These circuits may be power circuits or logical circuits or measuring circuits which are connected to respective metallizations 55a (with optional protective layer 11a) and 55b (with optional protective layer 11b) by through contacts 10a, 10b. The exemplary semiconductor zones 4a and 4b may be of n-type and the exemplary semiconductor zones 3a and 3b may be of p-type. However, the doping relations may also be reversed. Furthermore, the detailed structure of semiconductor mesas 100a, 100b typically depends on the desired functions of the IC. To facilitate front side contacting of the IC, the metallizations 55a, 55b and 55c are typically separated from each other and a further gate metallization (not shown in FIG. 30) by an insulating layer 17, for example an IMID-layer.

Figure 31:
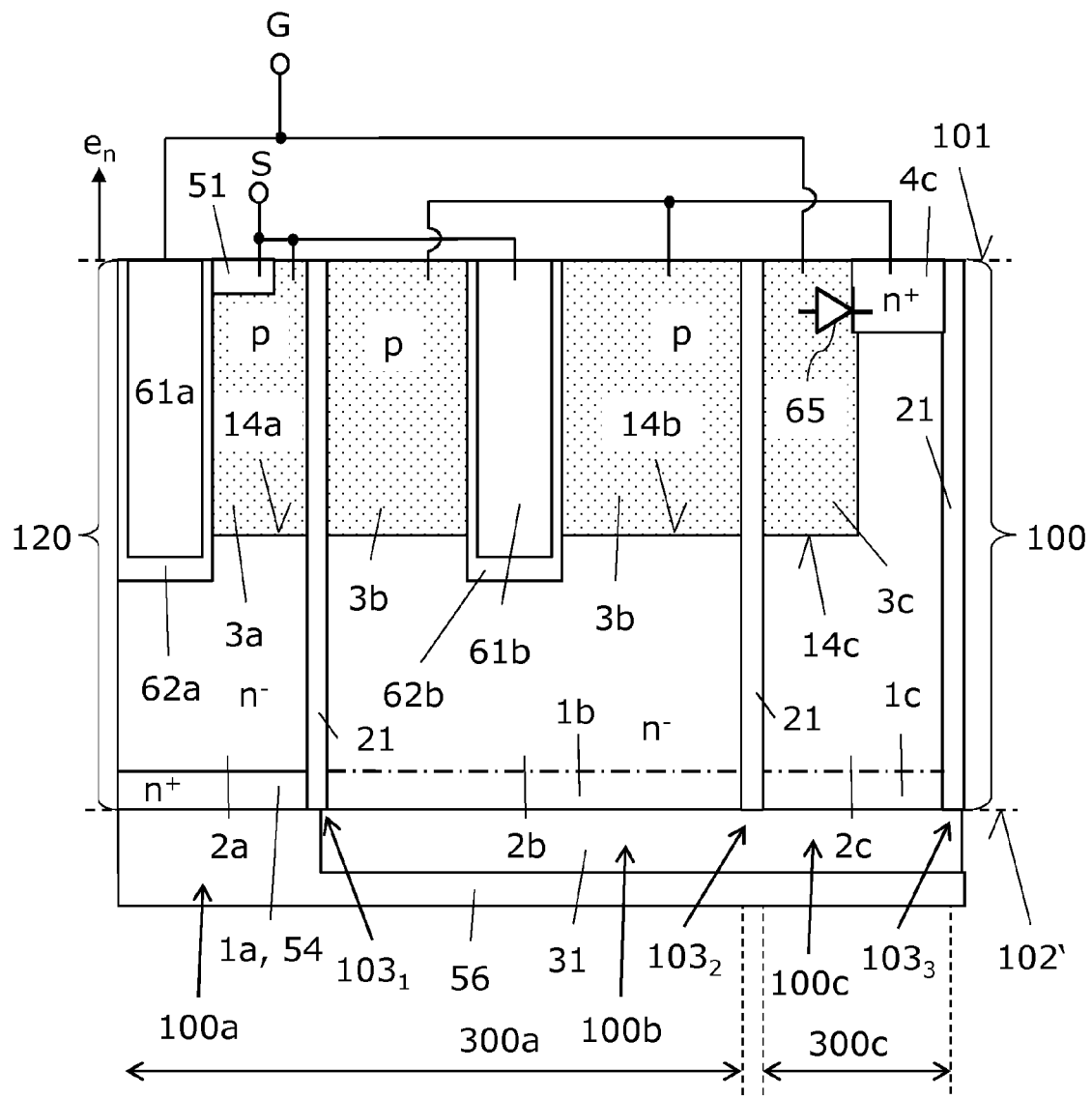
FIG. 31 illustrates a vertical cross-section through a semiconductor body of a semiconductor device with several semiconductor mesas, each including a respective electronic circuit, according to another embodiment.

Referring to FIG. 31, a further semiconductor component 3000 that may be produced with the methods explained herein is explained. Semiconductor component 3000 is similar to semiconductor component 1002 but includes, in the shown vertical cross-section, three insulation trenches $103_1$, $103_2$, $103_3$. A second insulation layer 31 is arranged on back surface 102' and partially recessed. The insulation trenches $103_1$, $103_2$, $103_3$ and the second insulation layer 31 form an insulating structure which insulates semiconductor mesas 100a, 100b, 100c from each other.

For sake of clarity only a right portion of an active area of semiconductor component 3000 is illustrated in FIG. 31. In the exemplary embodiment, semiconductor device 3000 may be operated as a TEDFET (Trench Extended Drain Field-Effect Transistor). Accordingly, semiconductor body 100 includes a vertical MOSFET-structure in semiconductor mesa 100a. For sake of clarity only a most right portion of the vertical MOSFET-structure is illustrated in FIG. 31. A gate electrode 61a which is insulated from adjacent semiconductor regions 2a, 3a by a gate dielectric region 62a extends from the first surface 101 through the p-type body region 3a and partially into an $n^-$-type drift region 2a which forms a pn-junction 14a with body region 3a. $N^+$-type source region 51 and p+-type body contact region (not shown in FIG. 31) are embedded in body region 3a and in ohmic contact with a source metallization symbolized by the numeral S. The drift region 2a is in ohmic contact with a drain metallization 56 via a drain contact region 1a. Drain contact region 1a is typically formed from the back surface 102' after thinning semiconductor body 100, for example by implantation and a subsequent drive-in process or anneal process. In another embodiment, optional $n^+$-type semiconductor regions 1b, 1c are also arranged in semiconductor mesa 100b and semiconductor mesa 100c, respectively, as indicate by the dashed-dotted line in FIG. 31. The manufacturing of such a semiconductor component may even be simpler as no additional implantation process at the back surface 102' are required, for example when the initially provided semiconductor body 100 includes an $n^+$-type semiconductor substrate and an n-type epitaxial layer arranged thereon, as explained with regard to FIG. 19.

In addition, a drift channel control structure is formed in semiconductor mesa 100b next to the MOSFET-structure formed in neighboring semiconductor mesa 100a. A drift control region 2b, which may also be of $n^-$-type or $p^-$-type, is arranged adjacent to drift region 2a. Drift control region 2b is dielectrically insulated from drift region 2a by the first insulation layer 21 arranged in insulation trench $103_1$ and extending to the second insulation layer 31. Accordingly, drift control region 2b is also insulated from drain metallization 56. The function of the drift control region 2b is to control a conducting channel in the drift region 2a along the first insulation layer 21 of insulation trench $103_1$ if the MOSFET-structure is in its on-state. Drift control region 2b therefore serves to reduce the on-resistance of the overall transistor component.

Unlike in usual MOSFETs, drift region 2a of semiconductor component 3000 may, disregarding of the type of the MOS transistor structure, be n-doped or p-doped. If, for example, in an n-type MOSFET-structure drift region 2a is n-doped, then an accumulation channel is formed along the first insulation layer 21 of insulation trench $103_1$ and controlled by drift control region 2b. In this embodiment, the first insulation layer 21 of insulation trench $103_1$ is also referred to as accumulation layer and accumulation oxide, respectively. If drift region 2a is p-doped in an n-type MOSFET-structure, then an inversion channel forms along the first insulation layer 21 of insulation trench $103_1$ in drift region 2a, if the component is in its on-state. Like a usual MOSFET this component is in its on-state if a voltage is applied between a source region 51 and a drain region 54 formed by a lower portion 1a of semiconductor mesa 100a and between source and drain metallizations S, 56, respectively, and if a suitable electrical potential is applied to gate electrode 61a that effects a conducting channel in body region 3a between source region 51 and drift region 2a. In an n-type MOSFET-structure the voltage to be applied between drain region 54 and source region 51 in order to switch the component in its on-state is a positive voltage, and the gate potential is a positive potential as compared to source potential.

If the semiconductor component 3000 is in its on-state charge carriers are required in the drift control region 2b to form the accumulation or inversion channel along the first insulation layer 21 of insulation trench $103_1$ in the drift region 2a. In a semiconductor component 3000 having an n-type MOSFET structure, holes are required in the drift control region 2b for forming this conducting channel. These charge carriers in the drift control region 2b are only required, if the component is in its on-state. If the component is in its blocking mode, these charge carriers are removed from drift control region 2b and—equivalently to drift region 2a—a space charge zone or depletion zone forms in drift control region 2b. In this connection it should be mentioned that drift control region 2b may be of the same conduction type as drift region 2a or may be of a complementary conduction type.

The charge carriers that are moved from drift control region 2b, if the component is in its blocking mode or switched-off, are stored in an integrated capacitor structure until the component is switched on for the next time. This integrated capacitor structure is formed in a connection region 3b that adjoins drift control region 2b and that is p-doped for an n-type component. Further, the integrated capacitor structure can partly extend into drift control region 2b. Connection region 3b and drift control region 2b act as the carrier layer for an insulated electrode 61b of the integrated capacitor structure. Electrode 61b is insulated by a dielectric layer 62b and in the following also referred to as insulated capacitor electrode. For providing charge carriers to the drift control zone 2b, if the component is switched on for the first time, i.e., if the integrated capacitor structure has not been charged, yet, drift control region 2b may be coupled to a gate terminal and gate metallization G, respectively, via a connection region 3b. In this case, charge carriers are provided from a gate driver circuit (not shown in FIG. 31) that, in operation of semiconductor component 400, is coupled to the gate terminal G. A diode 65 is formed between a p-type semiconductor zone 3c and an n-type semiconductor zone 4c in semiconductor mesa 100c which is insulated by the first insulation layer 21 of insulation trench $103_2$ and the second insulation layer 31. Diode 65 is coupled between gate terminal G and the connection region 3b and serves to prevent discharging the drift control region 2b in the direction of the gate terminal G. Due to insulating semiconductor mesa 100b by an insulation structure formed by first insulation layer 21 of insulation trenches $103_1$, $103_2$ and the second insulation layer 31, discharging drift control region 2b to adjacent semiconductor regions 1a, 2a, and 2c is prevented. In the exemplary embodiment, two different circuits, namely a TEDTFET and the diode 65, which are electrically decoupled by a wiring on the first surface 101, are formed in respective parts 300a, 300c of semiconductor component 3000 forming an integrated circuit. In further embodiments, the gate driver circuit and further circuits may also be integrated, typically be formed in further insulated semiconductor mesas. An example is explained with regard to FIG. 32.

Figure 32:
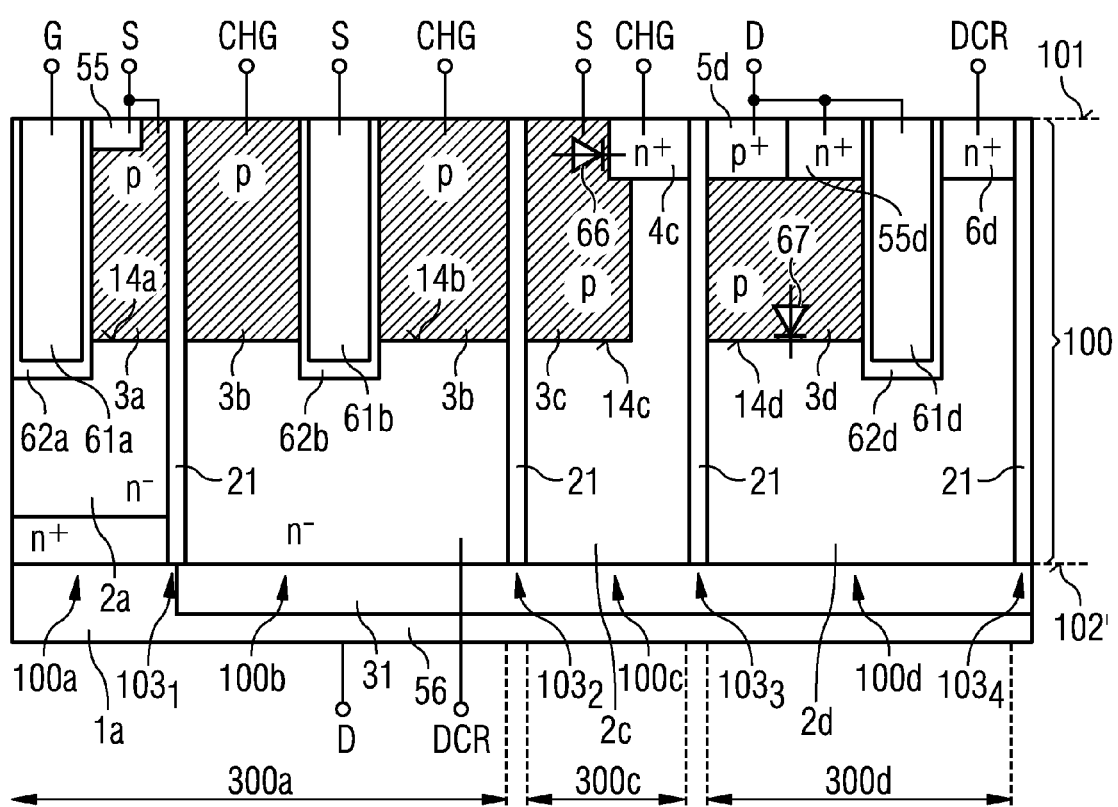
FIG. 32 illustrates a vertical cross-section through a semiconductor body of a semiconductor device with several semiconductor mesas, each including a respective electronic circuit, according to yet another embodiment.

Semiconductor component 3002 illustrated in the vertical cross-section of FIG. 32 is similar to semiconductor component 3000 and may also be formed with the methods explained herein. However, semiconductor component 3000 further includes a circuit for charging the accumulation oxide 21 formed in insulation trench $103_1$. In the exemplary embodiment, the circuit for charging the drift control region 2b is formed in insulated semiconductor mesa 100d which is insulated from the other semiconductor mesa 100a, 100b, 100c at least by the first insulation layer 21 of insulation trenches $103_3$, $103_4$ and by the adjoining second insulation layer 31. The circuit for charging the accumulation oxide includes an electrode 61d which is insulated by a dielectric region 62d. The electrode 61d as well as a $p^+$-type semiconductor zone 5d an adjoining an $n^+$-type semiconductor zone 55d are connected with the drain metallization as indicated by the reference sign D. A diode 67 is formed between a p-type semiconductor region 3d, which adjoins the semiconductor zones 5d and 55d, and an n-type semiconductor region 2d. As indicated by the reference sign DCR, an $n^+$-type semiconductor zone 6d which adjoins the n-type semiconductor region 2d is connected with the drift control region 2b that may be charged by the circuit for charging the accumulation oxide via a not illustrated wiring.

Insulated semiconductor mesa 100c includes a Z-diode 66 which is connected between a charge gate terminal CHG and source terminal S, Note that the exemplary circuitry illustrated in FIG. 32 typically includes further circuits and components, respectively, which are arranged in further insulated semiconductor mesas. For example, a further diode 65 as illustrated in FIG. 31 is typically also integrated and connected between a gate terminal G and charge gate terminal CHG. Furthermore, a temperature measuring circuit and/or a current measuring circuit may additionally be formed in respective insulated semiconductor mesas. Accordingly, a complex IC with low cross-talk and/or low leakage current may be provided.

Figure 33:
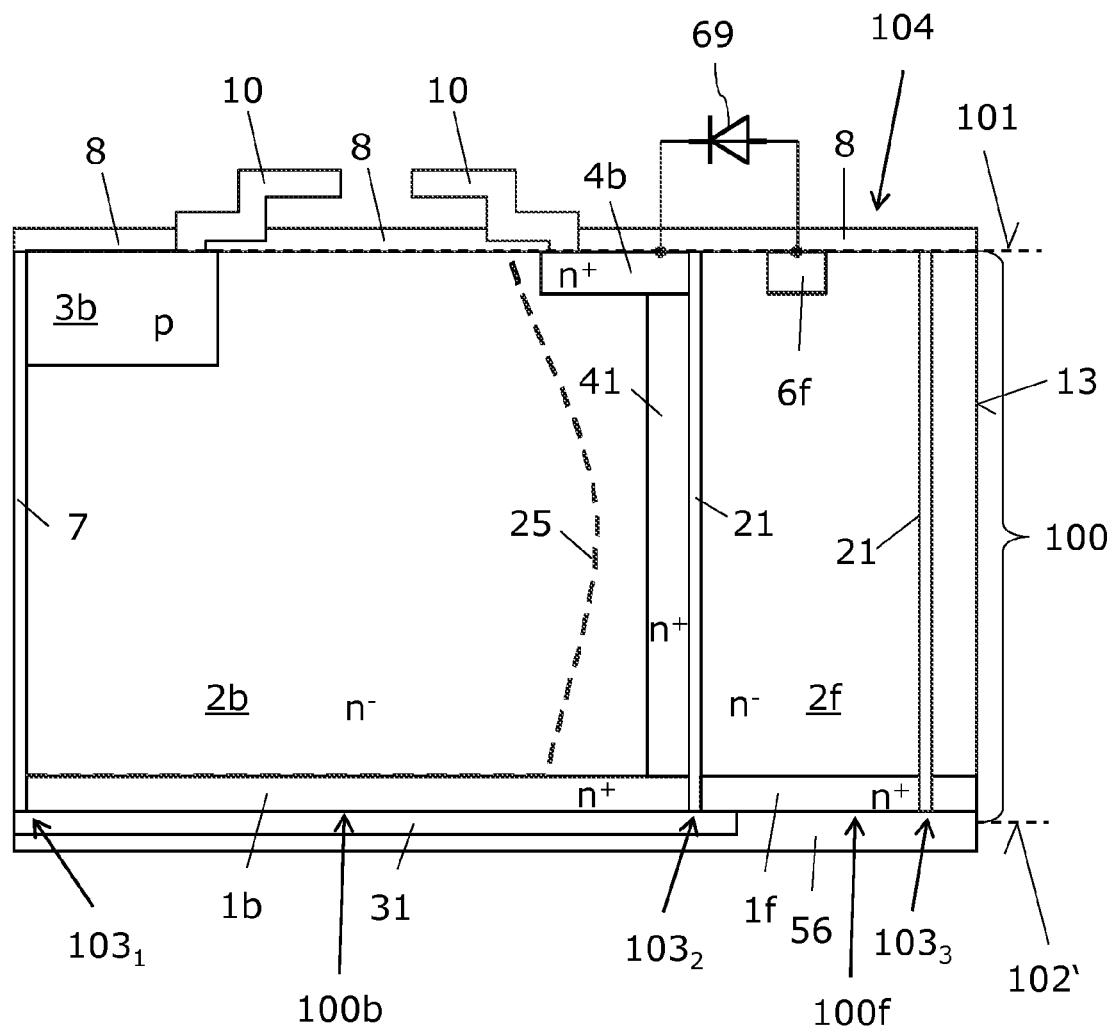
FIG. 33 illustrates a vertical cross-section through a semiconductor body of a semiconductor device with two semiconductor mesas, each including a respective electronic circuit, according to still another embodiment.

Referring to FIG. 33 showing a vertical cross-section through a semiconductor body 100, a further semiconductor component 3004 is explained. Semiconductor component 3002 is similar to the semiconductor component 3000, 3002 and may also be formed with the methods explained herein. For sake of clarity, only a most right section of semiconductor component 3004 is shown in FIG. 33. Since the drift control region 2b is electrically insulated from the drain region (not shown in FIG. 33) and at back surface 102', there is the risk of charge carriers accumulating in the drift control region 2b. In the case of an n-doped drift control region 2b, when the component is in blocking mode, electrons and holes can be generated on account of thermal charge carrier generation within the drift control region 2b, the holes being conducted away via connection region 3b, while the electrons remain in the drift control region 2b and may negatively charge the drift control zone 21 in the long term.

In order to prevent such charging of the drift control region 2b, the drift control region 2b can be connected to the drain metallization 56 via a rectifier element 69, such as a diode, for example, in the edge region 104 of the semiconductor body 100. In the exemplary embodiment, edge region 104 is formed in the laterally insulated semiconductor mesa 100f arranged between insulation trenches $103_2$, $103_3$. Similar as explained above with regard to FIG. 31 for the diode 65, rectifier element 69 may also be formed within semiconductor mesa 100f as diode 69.

Typically, a multiplicity of lattice defects is present along the edge 13, the defects bringing about a sufficient conductivity of the semiconductor body along the edge 13. The lattice defects result from the division, for example sawing apart, of a wafer into the individual semiconductor bodies. Due to the first insulating layer 21 of insulation trench $103_3$, further drifting of lattice defects into an active area is avoided and thus the reliability of semiconductor component 3004 increased.

Close to the first surface 101, the edge region 104 of semiconductor body 100 is typically at the same electrical potential as the back side, for example on drain potential. When the semiconductor component 3004 is in blocking mode, the connection region 3b is at an electrical potential that is significantly lower than the drain potential. When the component is in blocking mode, the edge region 104 is thus at drain potential, while the connection region 3b is at a significantly lower potential. Via the rectifier element 69, a connection zone 4b is approximately at drain potential when the component is in blocking mode. On account of the potential difference between the connection region 3b and the connection zone 4b when the component is in blocking mode, a space charge region forms in the drift control region 2b in a lateral direction as schematically illustrated by the dashed line 25. The space charge region takes up the voltage difference. In order to influence the electric field, field plates 10 can be provided, of which one is connected to the connection zone 4b of semiconductor mesa 100b and one is connected to the connection zone 6f of semiconductor mesa 100f via diode 69.

The optional semiconductor region 1b doped more highly than the drift control region 2b ensures that the drift control region 2b is, at its drain-side end, i.e. close to back surface 102', at an identical electrical potential at all points.

It should be pointed out that instead of the edge termination with field plates 10 other edge terminations known in principle are also possible e.g., on the basis of field rings, partially or fully depletable dopings (VLD edges, variation of lateral doping), coverings with insulating, semi-insulating or electroactive layers also in combination or in combination with field plates 10.

The rectifier element 69 can be realized as a diode, and may not have a particularly high voltage blocking capability in the reverse direction but rather prevent at least the flowing over of accumulation charge from the drift Io control zone 21 in a direction of the drain. However, in order to prevent the charge carriers accumulated in the drift control zone 2b, that is to say holes in the case of an n-doped component, from flowing away via the rectifier element 69 with the component driven in the on state, the connection zone 4b can be doped very highly.

Typically, the rectifier element 69 is also integrated in the semiconductor body 100 similar as explained with regard to FIG. 31 for the diode 65. Furthermore, the edge termination structure and the edge region 104 of semiconductor component 3004 may also be integrated into the semiconductor component 3000 and 3002 explained above with regard to FIGS. 31 and 32, respectively. The resulting semiconductor components may also be produced with the methods described herein.

The methods for producing semiconductor components as explained herein have the following processes in common: a semiconductor body with a first surface and a second surface opposite to the first surface is provided; at least one insulation trench which extends into the semiconductor body from the first surface is formed; a first insulation layer is formed on one or more sidewalls of the at least one insulation trench; semiconductor material of the semiconductor body is removed from the second surface and a second insulation layer which extends to the first insulation layer is formed at the surface formed by removing the semiconductor material from the second surface. Typically, that at least two semiconductor mesas are formed which are insulated from each other by the first insulation layer and the second insulation layer.

According to an embodiment of a method for producing a semiconductor component, the method includes: a semiconductor body with a first surface and a second surface opposite to the first surface is provided; an insulation trench which extends into the semiconductor body from the first surface is formed; a first insulation layer is formed on one or more sidewalls of the insulation trench; semiconductor material of the semiconductor body is removed from the second surface to expose at least parts of the first insulation layer, or to remove at least parts of the first insulation layer; and a second insulation layer which extends to the first insulation layer is formed on the second surface.

Typically, at least two insulation trenches are formed in a vertical cross-section that is substantially orthogonal to the first surface to separate semiconductor mesas from each other.

Alternatively, the two insulation trenches or 2 sections of one insulation trench are formed by etching a wide trench, covering the sidewalls of the wide trench by an insulator, removing the insulator from the bottom of the trench and filling the empty space with monocrystalline semiconductor material, typically by selective epitaxy.

According to an embodiment of a method for producing a semiconductor component, the method includes: providing a semiconductor body with a first surface and a second surface opposite the first surface; forming an insulation trench which extends into the semiconductor body from the first surface and which in a horizontal plane of the semiconductor body de-fines a via region of the semiconductor body; forming a first insulation layer at least on one or more sidewalls of the insulation trench; removing semiconductor material of the semiconductor body from the second surface to expose at least parts of the first insulation layer, to remove at least parts of the first insulation layer, or to leave at least partially a semiconductor layer with a thickness of less than 1 μm between the first insulation layer and the second surface; forming a first contact electrode on the via region in the region of the first surface; and forming a second contact electrode on the via region in the region of the second surface.

According to an embodiment, the method further includes forming a second insulation layer on the second surface which extends to the first insulation layer.

According to an embodiment, the insulation trench is formed as a closed loop.

Typically, the via region is enclosed by the insulation trench. Further, the via region may be arranged outside the semiconductor region enclosed by the insulation trench.

According to an embodiment, the insulation trench together with an edge of the semiconductor body or a scribe line disposed on the semiconductor body forms a closed loop.

According to another embodiment, the semiconductor material is removed from the second surface so that the first insulation layer is uncovered.

According to an embodiment, the method further includes forming a first insulation trench which forms a first closed loop, and forming a second insulation trench which forms a second closed loop within the first closed loop, wherein the via region is arranged between the first insulation trench and the second insulation trench.

According to an embodiment, the method further includes introducing dopant atoms into the via region. The dopant atoms may, for example, be introduced via the insulation trench and/or the first surface.

According to an embodiment, the method further includes completely filling the insulation trench with the first insulation layer.

According to an embodiment, the method further includes forming the first insulation layer on the sidewalls of the insulation trench so that a residual trench remains, and filling the residual trench with a filling material. The filling material may be an electrically conductive material.

According to an embodiment, the method further includes forming a doped contact region in the via region below the first surface, and producing the first contact electrode such that it contacts the doped contact region.

According to an embodiment, the method further includes producing an insulation on the insulation trench on the second surface after uncovering the first insulation layer.

According to an embodiment, the method further includes producing a contact trench in the via region, at least partially filling the contact trench with an electrically conductive material; uncovering the conductive material at the second surface, and producing the second contact electrode so that the second contact electrode contacts the conductive material. Typically, the conductive material is a metal or a doped polycrystalline semiconductor material.

According to an embodiment, the insulation trench and the contact trench are produced using one or more common method steps.

According to an embodiment, the method further includes producing a gate electrode electrically connected to the first contact electrode in the region of the first surface, producing a source region below the first surface and a source electrode electrically connected to the source region and electrically insulated from the gate electrode at least partially above the first surface, and producing a drain electrode electrically insulated from the second contact electrode on the second surface, so that a MOS transistor is formed.

According to an embodiment, the method further includes providing the semiconductor body with a first semiconductor layer and a second semiconductor layer on top of the first semiconductor layer, wherein the first semiconductor layer defines the second surface, and the second semiconductor layer defines the first surface, and wherein the source region is formed in the second semiconductor layer.

According to an embodiment of a semiconductor component, the component includes: a semiconductor body with a first surface and a second surface; a first contact electrode in a region of the first surface; a second contact electrode in a region of the second surface; a semiconductor via region extending between the first and second contact electrodes; and an insulation layer separating the via region in a horizontal direction of the semiconductor body from other regions of the semiconductor body.

According to an embodiment, the semiconductor component is implemented as an MOS transistor, further including a gate electrode electrically connected to the first contact electrode in the region of the first surface, a source region arranged below the first surface, a source electrode electrically connected to the source region, electrically insulated from the gate electrode, and arranged at least partially above the first surface, and a drain electrode electrically insulated from the second contact electrode on the second surface.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing a semiconductor component, comprising:
   providing a semiconductor body with a first surface and a second surface opposite to the first surface;
   forming an insulation trench from the first surface into the semiconductor body so that the insulation trench is, in a projection onto the first surface, substantially ring-shaped;

forming a first insulation layer at least on one or more sidewalls of the insulation trench so that the first insulation layer forms, in the projection onto the first surface, a first closed loop;

removing semiconductor material of the semiconductor body from the second surface to expose bottom portions of the first insulation layer and to form a back surface;

depositing a second insulation layer on the back surface such that at least two semiconductor mesas are formed which are insulated from each other by the first insulation layer and the second insulation layer;

forming a contact opening in the second insulation layer that extends to one of the at least two semiconductor mesas, such that the insulation trench remains covered by the second insulation layer at the back surface after the contact opening is formed in the second insulation layer;

forming an electrode that contacts the one of the at least two semiconductor mesas at the second surface through the contact opening, the electrode being separated from the insulation trench by the second insulation layer; and forming a second insulation trench which forms, in the projection onto the first surface, a second closed loop within the first closed loop.

2. The method of claim 1, wherein the second insulation layer comprises at least one of a boron-silicate glass, a spin-on glass, a silicone, a polymerized imide, a parylene or a polymerized benzocyclobutene, an organosilicate dielectric, a synthetic material, and a cured resin.

3. The method of claim 1, wherein the insulation trench is completely filled with the first insulation layer.

4. The method of claim 1, further comprising filling the insulation trench with a conductive material prior to depositing the second insulation layer.

5. The method of claim 4, wherein the conductive material is selected from the group consisting of a doped amorphous semiconductor material, a doped polycrystalline semiconductor material, a metal, a silicide and carbon.

6. The method of claim 1, wherein the second insulation layer is mask-less deposited on the back surface.

7. The method of claim 1, wherein forming the insulation trench comprises a Bosch process.

8. The method of claim 1, wherein the insulation trench forms a rectangular ring or an ellipsoidal ring.

9. The method of claim 1, wherein removing semiconductor material of the semiconductor body comprises at least one of grinding, polishing, a CMP-process and etching.

10. The method of claim 1, wherein the semiconductor body is thinned to a vertical thickness between the first surface and the back surface of less than about 50 µm by removing semiconductor material of the semiconductor body.

11. The method of claim 1, wherein the semiconductor body comprises an epitaxial layer and wherein the insulation trench is etched completely through the epitaxial layer.

12. The method of claim 1, wherein the semiconductor body is thinned to a vertical thickness between the first surface and the back surface by removing semiconductor material of the semiconductor body, wherein the insulation trench is etched to a vertical depth, and wherein the vertical thickness is about 5% to 30% smaller than the vertical depth.

13. The method of claim 1, further comprising mounting the semiconductor body with the first surface on a carrier system prior to removing semiconductor material of the semiconductor body.

14. The method of claim 13, wherein mounting the semiconductor body on the carrier system comprises attaching the semiconductor body to a glass substrate.

15. The method of claim 1, further comprising at least one of:

forming a diode structure in at least one of the at least two semiconductor mesas;

forming a capacitance structure in or on at least one of the at least two semiconductor mesas;

forming a transistor structure in at least one of the at least two semiconductor mesas;

forming a gate electrode structure on the first surface and on at least one of the at least two semiconductor mesas;

forming a trench gate electrode structure extending form the first surface into at least one of the at least two semiconductor mesas; and;

forming on the first surface a wiring between the at least two semiconductor mesas and/or to the diode structure and/or to the capacitance structure and/or to the transistor structure and/or to the gate electrode structure and/or to the trench gate electrode structure.

16. The method of claim 1, further comprising at least one of:

partially removing the second insulation layer to expose at least one of the at least two semiconductor mesas on the back side; and, forming a metallization on the back side in ohmic contact with the at least one of the at least two semiconductor mesas.

17. The method of claim 1, wherein the second insulation layer is deposited at a temperature below 400° C.

18. A method for producing a semiconductor component, comprising:

providing a semiconductor body with a first surface and a second surface opposite to the first surface;

etching an insulation trench from the first surface partially into the semiconductor body so that the insulation trench surrounds, in a projection onto the first surface, a semiconductor region of the semiconductor body;

forming a first insulation layer on one or more sidewalls of the insulation trench so that the first insulation layer forms, in the projection onto the first surface, a first closed loop;

filling the insulation trench with a conductive material;

processing the second surface comprising at least one of grinding, polishing, a CMP-process and etching to expose the first insulation layer;

depositing on the processed second surface a second insulation layer which extends to the first insulation layer;

forming a contact opening in the second insulation layer that extends to the processed second surface, such that the insulation trench remains covered by the second insulation layer at the second surface after the contact opening is formed in the second insulation layer;

forming an electrode that contacts the processed second surface through the contact opening, the electrode being separated from the insulation trench by the second insulation layer; and forming a second insulation trench which forms, in the projection onto the first surface, a second closed loop within the first closed loop.

19. The method of claim 18, wherein at least two semiconductor mesas are formed in the semiconductor body which are laterally insulated from each other by the first insulation layer.

20. The method of claim 19, wherein at least one of the two semiconductor mesas is completely insulated on the processed second surface by the second insulation layer after finishing processing the semiconductor component.

21. The method of claim 19, further comprising prior to processing the second surface at least one of:

forming an electric component in or on at least one of the at least two semiconductor mesas; and, forming on the first surface a wiring between the at least two semiconductor mesas and/or to the electric component.

22. The method of claim 18, further comprising finishing processing the semiconductor component from the first surface prior to processing the second surface.

23. The method of claim 18, further comprising prior to processing the second surface forming a TEDFET-structure in the semiconductor body, wherein the first insulation layer forms an accumulation oxide of the TEDFET-structure.

24. A semiconductor component, comprising:

a semiconductor body with a first surface and a back surface opposite to the first surface;

at least one insulation trench formed in the semiconductor body, the at least one insulation trench having, in a projection onto the first surface, a substantially ring-shaped geometry and comprising a first insulation layer extending from the first surface to the back surface and an electrically conductive material extending from the first surface to the back surface, the first insulation layer forming, in the projection onto the first surface, a first closed loop;

a second insulation layer deposited on the back surface of the semiconductor body, the second insulation layer covering the at least one insulation trench at the back surface and comprising at least one of aluminum nitride, diamond like-carbon, a boron-silicate glass, a spin-on glass, an organosilicate dielectric, a silicone, a polymerized imide, a parylene or a polymerized benzocyclobutene, a synthetic material, and a cured resin;

at least two semiconductor mesas formed in the semiconductor body, the at least two semiconductor mesas being laterally insulated from each other by the first insulation layer, and at least one of the two semiconductor mesas being completely insulated on the back surface by the second insulation layer;

a contact opening in the second insulation layer that extends to the back surface, such that the at least one insulation trench remains covered by the second insulation layer at the back surface;

an electrode that contacts the back surface through the contact opening, the electrode being separated from the at least one insulation trench by the second insulation layer; and a second insulation trench which forms, in the projection onto the first surface, a second closed loop within the first closed loop.

25. The semiconductor component of claim 24, wherein the semiconductor component is a TEDFET, and wherein the first insulation layer of the at least one insulation trench forms an accumulation oxide of the TEDFET.

26. The semiconductor component of claim 24, comprising a plurality of semiconductor mesas which are insulated from each other by respective insulation trenches and the second insulation layer.

27. The semiconductor component of claim 24, wherein the at least one insulation trench is substantially void-free.

28. The semiconductor component of claim 24, further comprising a gate electrode structure at the first surface and at or in at least one of the at least two semiconductor mesas.

\* \* \* \* \*